US011469252B2

(12) United States Patent
Park et al.

(10) Patent No.: US 11,469,252 B2
(45) Date of Patent: Oct. 11, 2022

(54) SEMICONDUCTOR DEVICE

(71) Applicant: Samsung Electronics Co., Ltd., Suwon-si (KR)

(72) Inventors: Seok Han Park, Seongnam-si (KR); Yong Seok Kim, Suwon-si (KR); Hui-Jung Kim, Seongnam-si (KR); Satoru Yamada, Yongin-si (KR); Kyung Hwan Lee, Seoul (KR); Jae Ho Hong, Hwaseong-si (KR); Yoo Sang Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 16/942,093

(22) Filed: Jul. 29, 2020

(65) Prior Publication Data

US 2021/0036020 A1    Feb. 4, 2021

(30) Foreign Application Priority Data

Jul. 31, 2019    (KR) .................. 10-2019-0092960

(51) Int. Cl.
| | |
|---|---|
| *H01L 27/11597* | (2017.01) |
| *H01L 27/1159* | (2017.01) |
| *H01L 29/06* | (2006.01) |
| *H01L 29/45* | (2006.01) |
| *H01L 29/78* | (2006.01) |
| *H01L 29/786* | (2006.01) |
| *H01L 49/02* | (2006.01) |

(52) U.S. Cl.
CPC .... *H01L 27/11597* (2013.01); *H01L 27/1159* (2013.01); *H01L 28/40* (2013.01); *H01L 29/0673* (2013.01); *H01L 29/45* (2013.01); *H01L 29/78391* (2014.09); *H01L 29/78696* (2013.01)

(58) Field of Classification Search
CPC .......... H01L 27/11597; H01L 27/1159; H01L 29/0673; H01L 29/45; H01L 29/78391; H01L 29/78696
See application file for complete search history.

(56) References Cited

U.S. PATENT DOCUMENTS

| | | |
|---|---|---|
| 7,821,047 B2 | 10/2010 | Ozaki |
| 9,281,044 B2 | 3/2016 | Ramaswamy et al. |
| 9,337,210 B2 | 5/2016 | Karda et al. |

(Continued)

*Primary Examiner* — Christine A Enad
(74) *Attorney, Agent, or Firm* — Harness, Dickey & Pierce, P.L.C.

(57) ABSTRACT

A semiconductor device is provided. The semiconductor device includes a first stacked structure including a plurality of first insulating patterns and a plurality of first semiconductor patterns alternately stacked on a substrate, the first stacked structure extending in a first direction parallel to an upper surface of the substrate, a first conductive pattern on one side surface of the first stacked structure, the first conductive pattern extending in a second direction crossing the upper surface of the substrate, and a first ferroelectric layer between the first stacked structure and the first conductive pattern, the first ferroelectric layer extending in the second direction, wherein each of the first semiconductor patterns includes a first impurity region, a first channel region and a second impurity region which are sequentially arranged along the first direction.

20 Claims, 22 Drawing Sheets

(56) References Cited

U.S. PATENT DOCUMENTS

| | | |
|---|---|---|
| 9,818,848 B2 | 11/2017 | Sun et al. |
| 9,847,337 B1 | 12/2017 | Juengling |
| 9,875,784 B1 | 1/2018 | Li et al. |
| 2018/0315859 A1 | 11/2018 | Ramaswamy |
| 2019/0074277 A1 | 3/2019 | Ramaswamy |
| 2019/0103407 A1* | 4/2019 | Kim .................. H01L 27/0688 |
| 2021/0407845 A1* | 12/2021 | Wang ................ H01L 23/5329 |
| 2022/0013524 A1* | 1/2022 | Ryu ................ H01L 27/10805 |

* cited by examiner

SEMICONDUCTOR DEVICE

CROSS-REFERENCE TO RELATED APPLICATION

This application claims priority from Korean Patent Application No. 10-2019-0092960 filed on Jul. 31, 2019 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device, and more particularly, to a semiconductor device including ferroelectrics.

2. Description of the Related Art

Higher integration of semiconductor devices is required to satisfy consumer demands for superior performance and inexpensive prices. In the case of two-dimensional or planar semiconductor devices, since their integration is mainly determined by the area occupied by a unit cell, integration is greatly influenced by the level of a fine pattern forming technology.

However, recently, as the design rule of a semiconductor device rapidly decreases, due to the resolution limitation of a process for forming the patterns necessary for the implementation of a semiconductor device, there is a limit in forming a fine pattern. Thus, three-dimensional semiconductor devices in which cells are three-dimensionally arranged have been proposed.

SUMMARY

At least one embodiment relates to a semiconductor device with improved performance and integration by implementing three-dimensionally arranged ferroelectric field effect transistors.

However, the example embodiments are not restricted to the one set forth herein. The above and other aspects of the example embodiments will become more apparent to one of ordinary skill in the art by referencing the detailed description given below.

According to an aspect of the present inventive concepts, there is provided an example embodiment, a semiconductor device comprising a first stacked structure including a plurality of first insulating patterns and a plurality of first semiconductor patterns alternately stacked on a substrate, the first stacked structure extending in a first direction, each of a first semiconductor pattern of the plurality of first semiconductor patterns including a first impurity region, a first channel region, and second impurity region arranged in sequential order along the first direction, the first direction being parallel to an upper surface of the substrate; a first conductive pattern on one a first side surface of the first stacked structure, the first conductive pattern extending in a second direction, the second direction crossing the upper surface of the substrate; and a first ferroelectric layer between the first stacked structure and the first conductive pattern, the first ferroelectric layer extending in the second direction.

According to an aspect of the present inventive concepts, there is provided an example embodiment of a semiconductor device comprising a first semiconductor pattern on a substrate, the first semiconductor pattern including a first impurity region, a first channel region and a second impurity region sequentially arranged in a first direction, the first direction being parallel to an upper surface of the substrate; a first gate electrode on a first side surface of the first channel region and a second gate electrodes on both a second side surfaces of the first channel region, the first gate electrode and the second gate electrodes respectively extending in a second direction, the second direction crossing the upper surface of the substrate; a first ferroelectric layer between the first channel region and the first gate electrode, the first ferroelectric layer extending in the second direction; and a second ferroelectric layer between the first channel region and the second gate electrode, the second ferroelectric layer extending in the second direction.

According to an aspect of the present inventive concepts, there is provided an example embodiment of a semiconductor device comprising a first stacked structure including a plurality of first insulating patterns and a plurality of first semiconductor patterns alternately stacked on a substrate, the first stacked structure extending in a first direction, each the plurality of first semiconductor patterns including a first impurity region, a channel region and a second impurity region sequentially arranged along the first direction, the first direction being parallel to an upper surface of the substrate; a plurality of first wiring patterns respectively connected to first ends of the plurality of first semiconductor patterns, the plurality of first wiring patterns extending in a second direction parallel to the upper surface of the substrate and crossing the first direction; a second wiring pattern connected to second ends of the plurality of first semiconductor patterns; a first gate electrode on a first side surface of the first stacked structure between the plurality of first wiring pattern and the second wiring pattern, the first gate electrode extending in a third direction crossing the upper surface of the substrate; and a first ferroelectric layer between the first stacked structure and the first gate electrode, the first ferroelectric layer extending in the third direction along a first side surface of the channel regions of the plurality of first semiconductor patterns.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Although the terms "first," "second," "third," etc., may be used herein to describe various elements, components, regions, and/or sections, these elements, components, regions, and/or sections, should not be limited by these terms. These terms are only used to distinguish one element, component, region, or section, from another region, layer, or section. Thus, a first element, component, region, layer, or section, discussed below may be termed a second element, component, region, or section, without departing from the scope of this disclosure.

When an element is referred to as being "on" or "connected to" another element, the element may be directly on or connected to the other element, or one or more other intervening elements may be present. In contrast, when an element is referred to as being "directly on" or "directly connected to" another element there are no intervening elements present.

Hereinafter, a semiconductor device according to example embodiments of the present inventive concepts will be described with reference to FIGS. 1 to 22.

Figure 1:
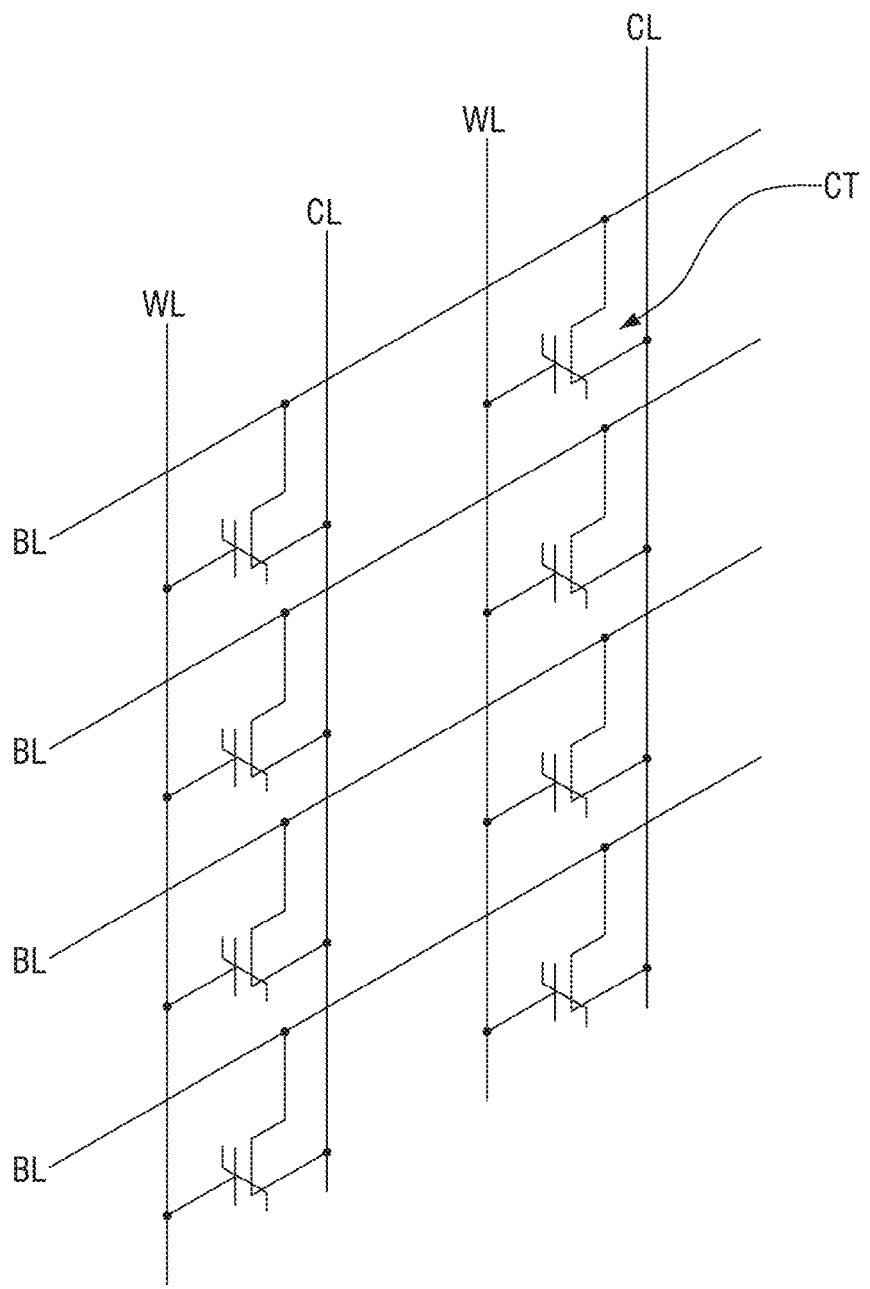
FIG. 1 is a circuit diagram illustrating a semiconductor device according to an example embodiment.
Figure 2:
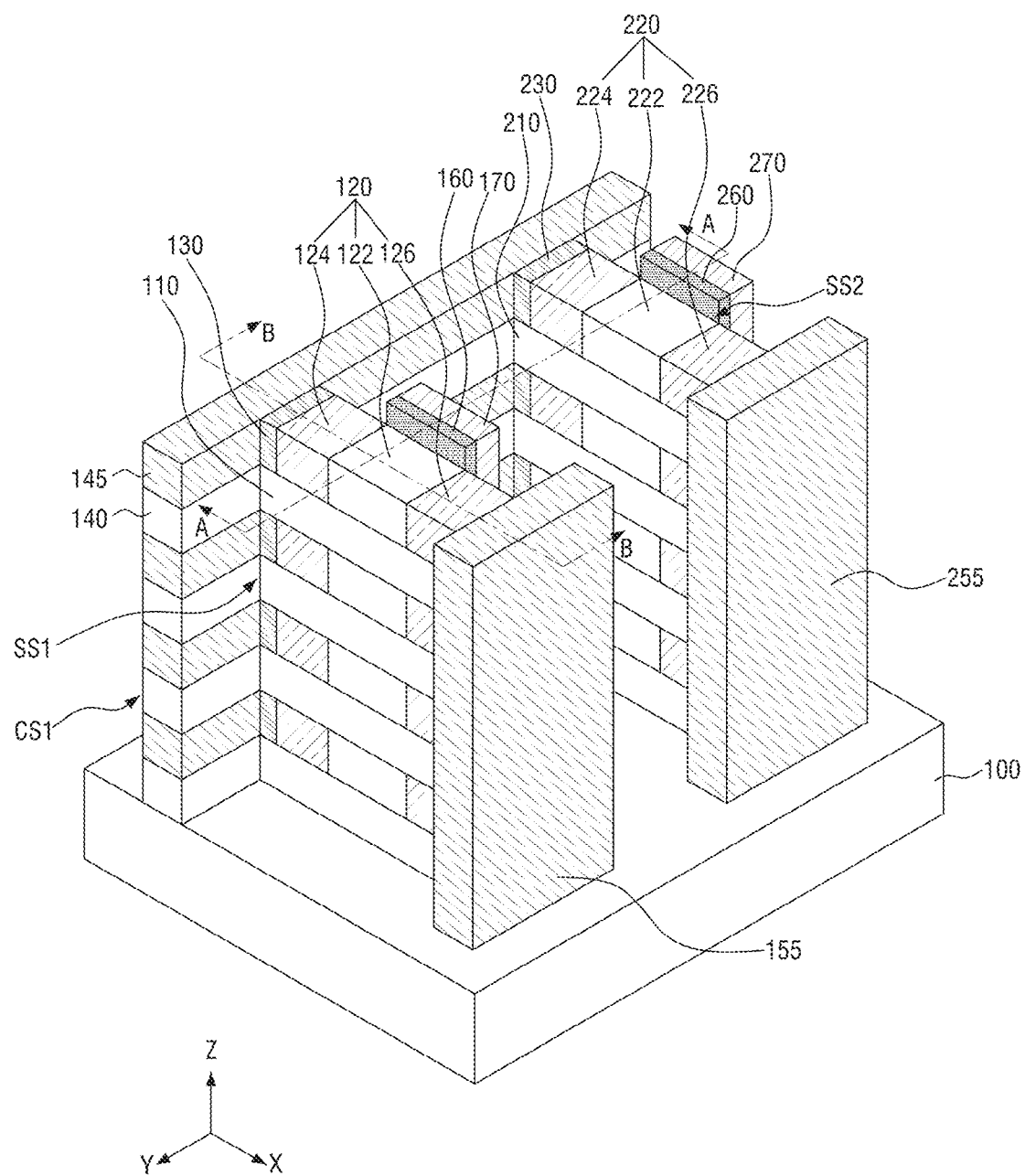
FIG. 2 is a schematic perspective view illustrating a semiconductor device according to an example embodiment.
Figure 3:
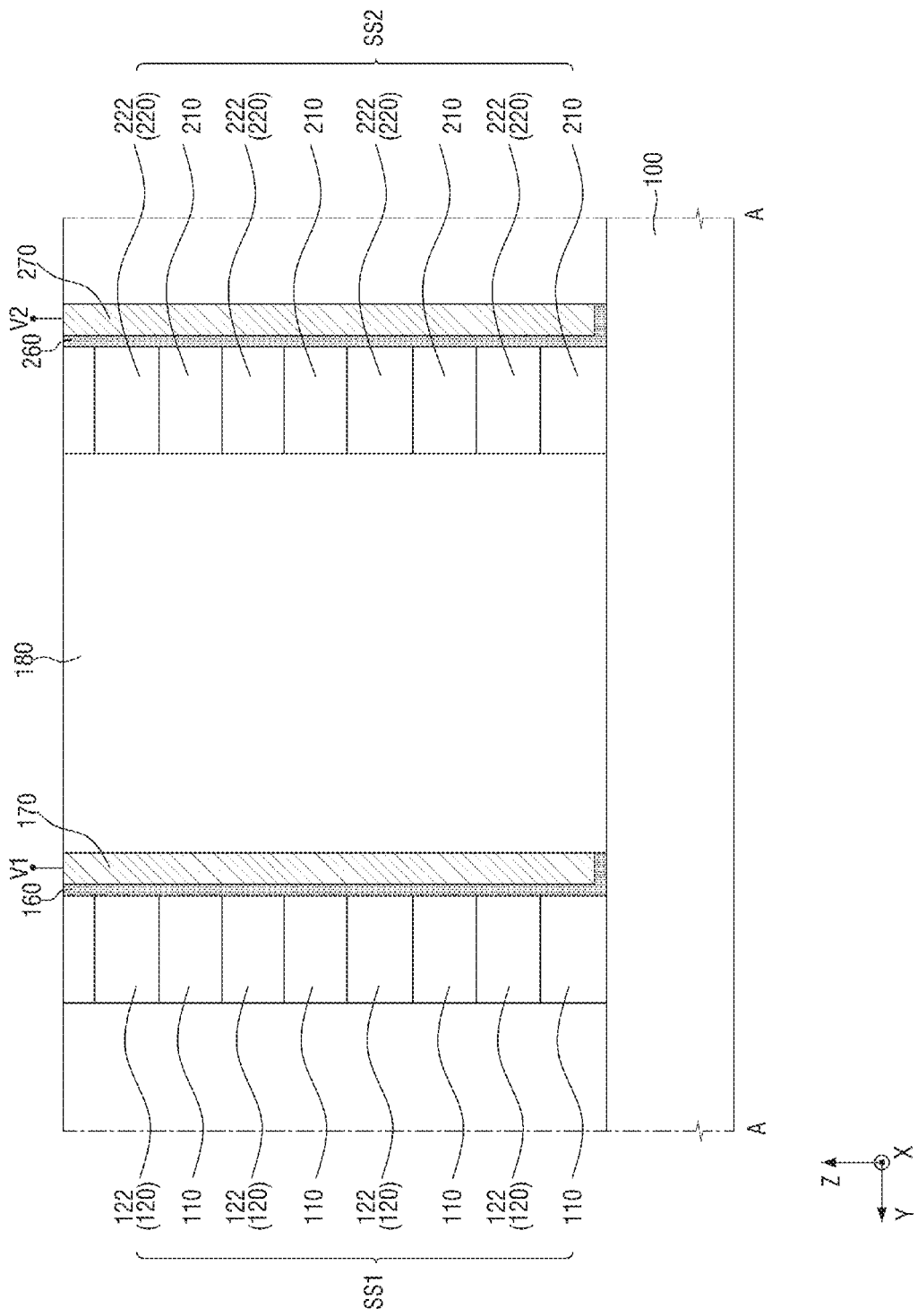
FIG. 3 is a cross-sectional view taken along line A-A of FIG. 2.
Figure 4:
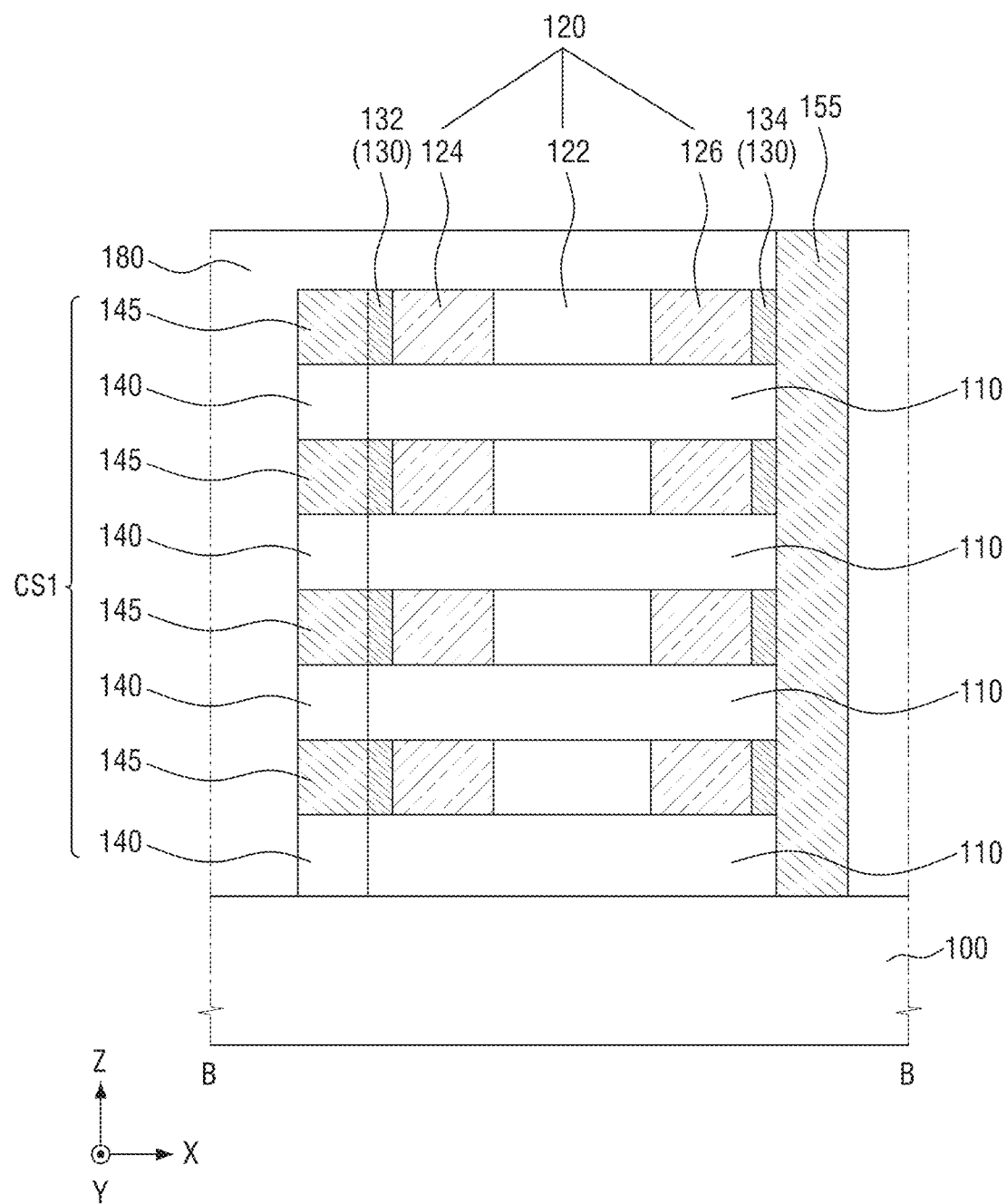
FIG. 4 is a cross-sectional view taken along line B-B of FIG. 2.

FIG. 1 is a circuit diagram illustrating a semiconductor device according to an example embodiment. FIG. 2 is a schematic perspective view illustrating a semiconductor device according to an example embodiment. FIG. 3 is a cross-sectional view taken along line A-A of FIG. 2. FIG. 4 is a cross-sectional view taken along line B-B of FIG. 2. For simplicity of description, the illustration of an interlayer insulating layer 180 is omitted in FIG. 2.

Referring to FIG. 1, a semiconductor device according to some embodiments may include a plurality of bit lines BL, a plurality of word lines WL and a plurality of cell transistors CT.

The plurality of bit lines BL may be two-dimensionally arranged. For example, the plurality of bit lines BL may be arranged on the same topological plane, be spaced apart from each other, and may extend from side by side. A plurality of cell transistors CT may be connected in parallel to each bit line BL. Although it is illustrated that two cell transistors CT are connected to one bit line BL, this is merely an example embodiment, and a bit line BL may have one cell transistor CT or three or more cell transistors (CT) connected to it.

The plurality of word lines WL may be two-dimensionally arranged. For example, the plurality of word lines WL may be arranged on the same topological plane, be spaced apart from each other, and may extend from side by side. A plurality of cell transistors CT may be connected in parallel to each word line WL. Although it is illustrated that four cell transistors CT are connected to one word line WL, this is merely an example embodiment, and a word line WL may have one cell transistor CT or three or more cell transistors (CT) connected to it. In some embodiments, each word line WL may extend in a direction crossing each bit line BL.

Each cell transistor CT may be connected to one word line WL and one bit line BL. The gate of each cell transistor CT may be connected to the word line WL. Further, the source of each cell transistor CT may be connected to the bit line BL.

The drain of each cell transistor CT may be connected to a wiring CL. In some embodiments, one wiring CL may correspond to one word line WL. For example, as illustrated, a plurality of cell transistors CT sharing one word line WL may share one wiring CL. In some embodiments, each wiring CL may extend in a direction crossing each bit line BL.

Referring to FIGS. 2 to 4, the semiconductor device described above with reference to FIG. 1 may be provided on a substrate 100. Specifically, the semiconductor device according to some embodiments may include the substrate 100, a first stacked structure SS1, a second stacked structure SS2, a first wiring structure CS1, a first conductive pattern 170, a second conductive pattern 270, a first ferroelectric layer 160, a second ferroelectric layer 260 and the interlayer insulating layer 180.

The substrate 100 may include, for example, a semiconductor substrate such as a silicon substrate, a germanium substrate, or a silicon-germanium substrate. Alternatively, the substrate 100 may include a silicon-on-insulator (SOI) substrate or a germanium-on-insulator (GOI) substrate.

The first stacked structure SS1 and the second stacked structure SS2 may be formed on the substrate 100. Each of the first stacked structure SS1 and the second stacked structure SS2 may extend in a first direction X parallel to the upper surface of the substrate 100. Further, the first stacked structure SS1 and the second stacked structure SS2 may extend in parallel with each other. For example, the first stacked structure SS1 and the second stacked structure SS2 may be arranged along a second direction Y which is parallel to the upper surface of the substrate 100 and crosses the first direction X.

In some embodiments, the first stacked structure SS1 and the second stacked structure SS2 may be formed at the same level. The term "the same level" as used herein means being formed by the same manufacturing process.

Each of the first stacked structure SS1 and the second stacked structure SS2 may include a plurality of semiconductor patterns which are vertically arranged. For example, the first stacked structure SS1 may include a plurality of first semiconductor patterns 120 arranged along a third direction Z crossing the upper surface of the substrate 100. Further, for example, the second stacked structure SS2 may include a plurality of second semiconductor patterns 220 arranged along the third direction Z.

In some embodiments, the first stacked structure SS1 may include a plurality of first insulating patterns 110 and a plurality of first semiconductor patterns 120 which are alternately stacked on the substrate 100. That is, the plurality of first semiconductor patterns 120 may be spaced apart from each other by the first insulating patterns 110. An example embodiment may include, for example, two to eight alternating stacks, but is not limited thereto. In addition, in some embodiments, the second stacked structure SS2 may include a plurality of second insulating patterns 210 and a plurality of second semiconductor patterns 220 which are alternately stacked on the substrate 100. That is, the plurality of second semiconductor patterns 220 may be spaced apart from each other by the second insulating patterns 210.

The plurality of first insulating patterns 110 and the plurality of second insulating patterns 210 may include an insulating material. For example, the plurality of first insulating patterns 110 and the plurality of second insulating patterns 210 may include, but is not limited to, silicon oxide.

Each of the first semiconductor patterns 120 and each of the second semiconductor patterns 220 may extend in the first direction X. Each of the first semiconductor patterns 120 and each of the second semiconductor patterns 220 may have, for example, a line shape, a bar shape, or a pillar shape extending in the first direction X, but the present disclosure is not limited thereto.

Each of the first semiconductor patterns 120 and each of the second semiconductor patterns 220 may include an elemental semiconductor material, for example, silicon (Si) or germanium (Ge), a compound semiconductor, a group Iv-Iv compound semiconductor, or a group III-v compound semiconductor, and/or a combination thereof.

Each first semiconductor pattern 120 may include a first impurity region 124, a first channel region 122 and a second impurity region 126 which are sequentially arranged along the first direction X. For example, the first channel region 122 may be interposed between the first impurity region 124 and the second impurity region 126. The first channel region 122 may correspond to the channel of a cell transistor CT described above with reference to FIG. 1.

The first impurity region 124 and the second impurity region 126 may be regions doped with impurities in the first semiconductor pattern 120. For example, the first impurity region 124 and the second impurity region 126 may include n-type impurities or p-type impurities. Accordingly, the first impurity region 124 and the second impurity region 126 may correspond to the source and the drain of one cell transistor CT described above with reference to FIG. 1.

Although FIGS. 2 and 4 illustrate the bottom surface of the first impurity region 124 and the bottom surface of the second impurity region 126 have the same height as the bottom surface of the first channel region 122, a person having skill in the art would recognize the example embodiment is not limited thereto. For example, the bottom surface of the first impurity region 124 and the bottom surface of the second impurity region 126 may be formed to be higher than the bottom surface of the first channel region 122.

Each second semiconductor pattern 220 may include a third impurity region 224, a second channel region 222 and a fourth impurity region 226 which are sequentially arranged along the first direction X. For example, the second channel region 222 may be interposed between the third impurity region 224 and the fourth impurity region 226. The second channel region 222 may correspond to the channel of the other cell transistor CT described above with reference to FIG. 1.

The third impurity region 224 and the fourth impurity region 226 may be regions doped with impurities in the second semiconductor pattern 220. For example, the third impurity region 224 and the fourth impurity region 226 may include n-type impurities or p-type impurities. Accordingly, the third impurity region 224 and the fourth impurity region 226 may correspond to the source and the drain of the other cell transistor CT described above with reference to FIG. 1.

The first wiring structure CS1 may be formed on the substrate 100. The first wiring structure CS1 may be connected to one end of the first stacked structure SS1. In some embodiments, the first wiring structure CS1 may extend in the second direction Y to be connected to one end of the first stacked structure SS1 and one end of the second stacked structure SS2.

The first wiring structure CS1 may include a plurality of wiring patterns vertically arranged. For example, the first wiring structure CS1 may include a plurality of first wiring patterns 145 arranged along the third direction Z.

In some embodiments, the first wiring structure CS1 may include a plurality of third insulating patterns 140 and a plurality of first wiring patterns 145 which are alternately stacked on the substrate 100. That is, the plurality of first wiring patterns 145 may be spaced apart from each other by the third insulating patterns 140.

The plurality of third insulating patterns 140 may include an insulating material. For example, the plurality of third insulating patterns 140 may include silicon oxide and/or germanium oxide, but is not limited thereto. In an example embodiment, the plurality of third insulating patterns 140 may be formed at the same level as the plurality of first and second insulating patterns 110 and 210.

Each first wiring pattern 145 may extend in the second direction Y. Each first wiring pattern 145 may be connected to one end of each first semiconductor pattern 120 and one end of each second semiconductor pattern 220. For example, each first wiring pattern 145 may be connected to the first impurity region 124 and the third impurity region 224. Each first wiring pattern 145 may correspond to each bit line BL described above with reference to FIG. 1.

Although FIGS. 2 and 4 illustrate the bottom surface of each first wiring pattern 145 has the same height as the bottom surface of the first semiconductor pattern 120, a person having skill in the art would recognize the example embodiment is not limited thereto. For example, as long as the first wiring pattern 145 is connected to the first impurity region 124, the bottom surface of the first wiring pattern 145 may be formed to be higher than the bottom surface of the first semiconductor pattern 120 or may be formed to be lower than the bottom surface of the first semiconductor pattern 120.

The plurality of first wiring patterns 145 may include a conductive material. For example, the plurality of first wiring patterns 145 may include at least one selected from the group consisting of a doped semiconductor material (doped silicon, doped germanium, etc.), conductive metal nitride (titanium nitride, tantalum nitride, etc.), metal (tungsten, titanium, tantalum, etc.), a metal-semiconductor compound (tungsten silicide, cobalt silicide, titanium silicide, etc.) and a combination thereof, but the present disclosure is not limited thereto.

In some embodiments, silicide layers 130 and 230 may be interposed between the first semiconductor pattern 120 and the first wiring pattern 145 and between the second semiconductor pattern 220 and the first wiring pattern 145. For example, as shown in FIGS. 2 and 4, a first silicide layer 132 may be formed between the first impurity region 124 and the first wiring pattern 145 to connect the first impurity region 124 and the first wiring pattern 145. The silicide layers 130 and 230 may be used to reduce contact resistance between the first semiconductor pattern 120 and the first wiring pattern 145 and contact resistance between the second semiconductor pattern 220 and the first wiring pattern 145.

The silicide layers 130 and 230 may include a metal-semiconductor compound. For example, the silicide layers 130 and 230 may include at least one selected from the group consisting of tungsten silicide, cobalt silicide, titanium silicide, nickel silicide, platinum silicide, tantalum silicate, and a combination thereof, but the example embodiment is not limited thereto.

The first conductive pattern 170 may be formed on a first side surface of the first stacked structure SS1. The first conductive pattern 170 and the first stacked structure SS1 may be arranged along the second direction Y. The first conductive pattern 170 may extend in the third direction Z. For example, as illustrated in FIG. 3, the first conductive pattern 170 may extend along the side surfaces of the plurality of first insulating patterns 110 and the side surfaces of the plurality of first semiconductor patterns 120. The first conductive pattern 170 may have, for example, a line shape, a bar shape, or a pillar shape extending in the third direction Z, but is not limited thereto.

The first conductive pattern 170 may cross the first channel region 122 of each first semiconductor pattern 120. For example, the first conductive pattern 170 may extend along the side surface of the first channel region 122 of each first semiconductor pattern 120.

The first conductive pattern 170 may correspond to one word line WL described above with reference to FIG. 1. That is, the first conductive pattern 170 may be a gate electrode of the cell transistor including the first semiconductor pattern 120. For example, when the cell transistor including the first semiconductor pattern 120 is turned on, a first gate voltage V1 may be applied to the first conductive pattern 170.

The second conductive pattern 270 may be formed on one side surface of the second stacked structure SS2. The second conductive pattern 270 and the second stacked structure SS2 may be arranged along the second direction Y. The second conductive pattern 270 may extend in the third direction Z. For example, as illustrated in FIG. 3, the second conductive pattern 270 may extend along the side surfaces of the plurality of second insulating patterns 210 and the side surfaces of the plurality of second semiconductor patterns 220. The second conductive pattern 270 may have, for example, a line shape, a bar shape, or a pillar shape extending in the third direction Z, but is not limited thereto.

The second conductive pattern 270 may cross the second channel region 222 of each second semiconductor pattern 220. For example, the second conductive pattern 270 may extend along the side surface of the second channel region 222 of each second semiconductor pattern 220.

The second conductive pattern 270 may correspond to the other word line WL described above with reference to FIG. 1. That is, the second conductive pattern 270 may be a gate electrode of the cell transistor including the second semiconductor pattern 220. For example, when the cell transistor including the second semiconductor pattern 220 is turned on, a second gate voltage V2 may be applied to the second conductive pattern 270. The second gate voltage V2 may be the same as the first gate voltage V1 or may be different from the first gate voltage V1.

In some embodiments, the first conductive pattern 170 and the second conductive pattern 270 may overlap each other in the second direction Y. For example, in plan view, the first conductive pattern 170 and the second conductive pattern 270 may be arranged in a row along the second direction Y.

The first conductive pattern 170 and the second conductive pattern 270 may include a conductive material. The conductive material of the first conductive pattern 170 and the second conductive pattern 270 may be the same conductive material as the first wiring pattern 145, or may be a different conductive material. For example, the first conductive pattern 170 and the second conductive pattern 270 may include at least one selected from the group consisting of a doped semiconductor material, conductive metal nitride, metal, a metal-semiconductor compound, and/or a combination thereof, but the present disclosure is not limited thereto. In some embodiments, the first conductive pattern 170 and the second conductive pattern 270 may be formed at the same level.

The first ferroelectric layer 160 may be interposed between the first stacked structure SS1 and the first conductive pattern 170. That is, the first ferroelectric layer 160 may be formed on one side surface of the first stacked structure SS1. The first ferroelectric layer 160 may extend along the third direction Z. For example, as illustrated in FIG. 3, the first ferroelectric layer 160 may extend along the side surfaces of the plurality of first insulating patterns 110 and the side surfaces of the plurality of first semiconductor patterns 120.

The second ferroelectric layer 260 may be interposed between the second stacked structure SS2 and the second conductive pattern 270. That is, the second ferroelectric layer 260 may be formed on one side surface of the second stacked structure SS2. The second ferroelectric layer 260 may extend along the third direction Z. For example, as illustrated in FIG. 3, the second ferroelectric layer 260 may extend along the side surfaces of the plurality of second insulating patterns 210 and the side surfaces of the plurality of second semiconductor patterns 220.

In some embodiments, the first ferroelectric layer 160 and the second ferroelectric layer 260 may overlap each other in the second direction Y. For example, in a plan view, the first ferroelectric layer 160 and the second ferroelectric layer 260 may be arranged in a row along the second direction Y.

In some embodiments, a portion of the first ferroelectric layer 160 may be interposed between the substrate 100 and the first conductive pattern 170, and a portion of the second ferroelectric layer 260 may be interposed between the substrate 100 and the second conductive pattern 270. For example, as illustrated in FIGS. 2 and 3, the first ferroelectric layer 160 may extend along the upper surface of the substrate 100 and the side surface of the first stacked structure SS1, and the second ferroelectric layer 260 may extend along the upper surface of the substrate 100 and the side surface of the second stacked structure SS2.

In addition, in some embodiments, as shown in FIG. 2, the width of the first ferroelectric layer 160 may be the same as the width of the first conductive pattern 170, and the width of the second ferroelectric layer 260 may be equal to the width of the second conductive pattern 270. The term "width" as used herein refers to a width in the first direction X. Further, the term "same" used herein not only means being completely identical but also includes a minute difference that may occur due to a process margin and the like.

The shapes of the first ferroelectric layer 160 and the second ferroelectric layer 260 may be attributable to the characteristics of the process of forming the first ferroelectric layer 160 and the second ferroelectric layer 260. For example, a ferroelectric layer may be formed to conformally extend along the substrate 100, the first stacked structure SS1 and the second stacked structure SS2. Subsequently, a conductive layer may be formed on the ferroelectric layer. Then, by patterning the conductive layer and the ferroelectric layer, the first conductive pattern 170 and the first ferroelectric layer 160 extending in the third direction Z may be formed on the side surface of the first stacked structure SS1. In addition, the second conductive pattern 270 and the second ferroelectric layer 260 extending in the third direction Z may be formed on the side surface of the second stacked structure SS2.

Each of the first ferroelectric layer 160 and the second ferroelectric layer 260 may include a ferroelectric material. For example, the first ferroelectric layer 160 and the second ferroelectric layer 260 may include ferroelectrics such as barium titanate ($BaTiO_3$), lead zirconate titanate ($PbZrTiO_3$, PZT), strontium bismuth tantalate ($SrBi_2Ta_2O_9$, SBT), bismuth iron oxide ($BiFeO_3$, BFO) and hafnium oxide ($HfO_2$), but the present disclosure is not limited thereto. In some embodiments, the first ferroelectric layer 160 and the second ferroelectric layer 260 may be formed at the same level.

In some embodiments, the other end of the first stacked structure SS1 may be connected to a second wiring pattern 155. For example, the first stacked structure SS1 may be interposed between the first wiring structure CS1 and the second wiring pattern 155 to be connected to the first wiring structure CS1 and the second wiring pattern 155.

The second wiring pattern 155 may extend in the third direction Z to be connected to the other end of each of the first semiconductor patterns 120. For example, the second wiring pattern 155 may be connected to the second impurity region 126. The second wiring pattern 155 may correspond to the one wiring CL described above with reference to FIG. 1.

In some embodiments, the other end of the second stacked structure SS2 may be connected to a third wiring pattern 255. For example, the second stacked structure SS2 may be interposed between the first wiring structure CS1 and the third wiring pattern 255 to be connected to the first wiring structure CS1 and the third wiring pattern 255.

The third wiring pattern 255 may extend in the third direction Z to be connected to the other end of each of the second semiconductor patterns 220. For example, the third wiring pattern 255 may be connected to the fourth impurity region 226. The third wiring pattern 255 may correspond to the other wiring CL described above with reference to FIG. 1.

The second wiring pattern 155 and the third wiring pattern 255 may include a conductive material. For example, the second wiring pattern 155 and the third wiring pattern 255 may include at least one selected from the group consisting of a doped semiconductor material, conductive metal nitride, metal, a metal-semiconductor compound and a combination thereof, but the present disclosure is not limited thereto. In some embodiments, the second wiring pattern 155 and the third wiring pattern 255 may be formed at the same level.

In some embodiments, the silicide layers 130 and 230 may be interposed between the first semiconductor pattern 120 and the second wiring pattern 155 and between the second semiconductor pattern 220 and the third wiring pattern 255. For example, as illustrated in FIG. 4, a second silicide layer 134 may be formed between the second impurity region 126 and the second wiring pattern 155 to connect the second impurity region 126 to the second wiring pattern 155. The silicide layers 130 and 230 may be used to reduce contact resistance between the first semiconductor pattern 120 and the second wiring pattern 155 and contact resistance between the second semiconductor pattern 220 and the third wiring pattern 255.

The interlayer insulating layer 180 may be formed on the substrate 100. Further, the interlayer insulating layer 180 may be formed to cover the first stacked structure SS1, the second stacked structure SS2, the first wiring structure CS1, the first conductive pattern 170, the first ferroelectric layer 160, the second conductive pattern 270 and the second ferroelectric layer 260.

The interlayer insulating layer 180 may include an insulating material. For example, the interlayer insulating layer 180 may include at least one of silicon oxide, silicon oxynitride, silicon nitride, or a low-k material having a lower dielectric constant than silicon oxide, but is not limited thereto.

Recently, as the design rule of a semiconductor device rapidly decreases, due to the resolution limitation of the process for forming the patterns necessary for the implementation of a semiconductor device, there is a limit in forming a fine pattern.

However, the semiconductor device according to some embodiments may implement three-dimensionally arranged ferroelectric field effect transistors (FeFET), thereby improving the integration and performance.

Figure 5:
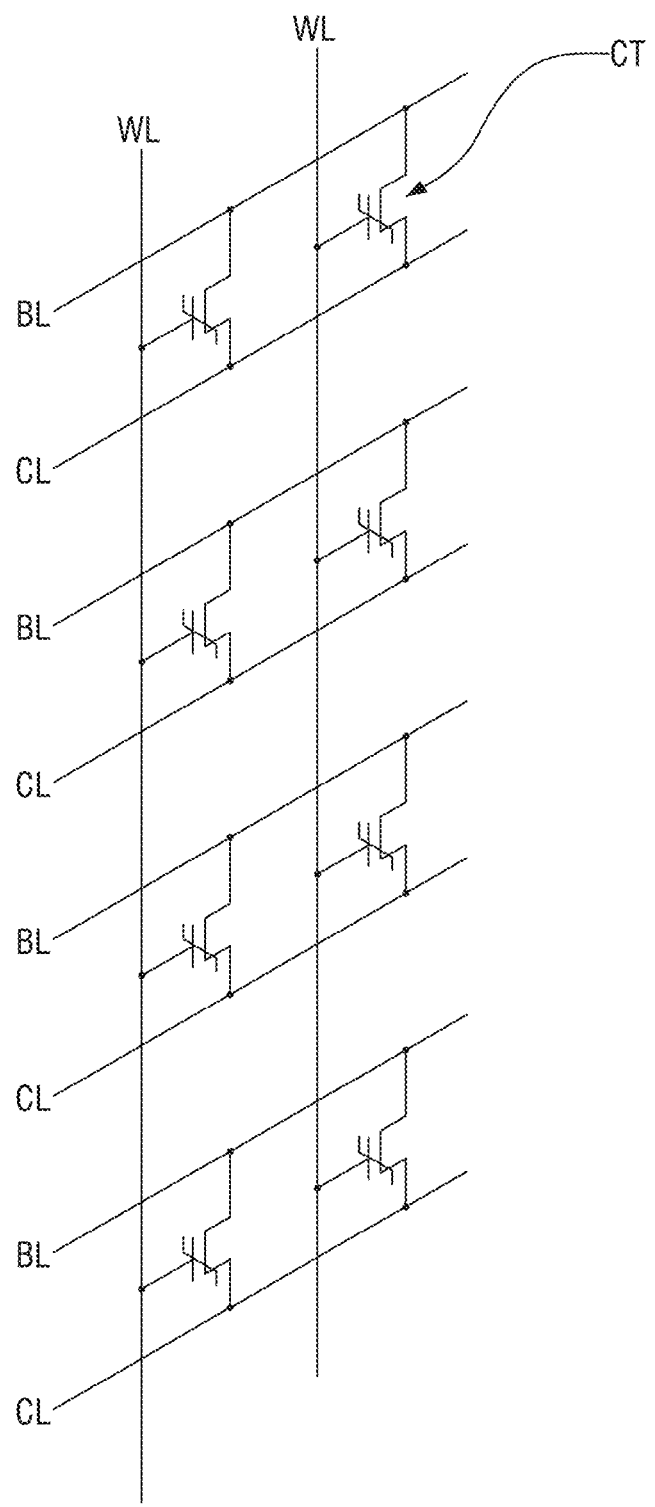
FIG. 5 is a circuit diagram illustrating a semiconductor device according to an example embodiment.
Figure 6:
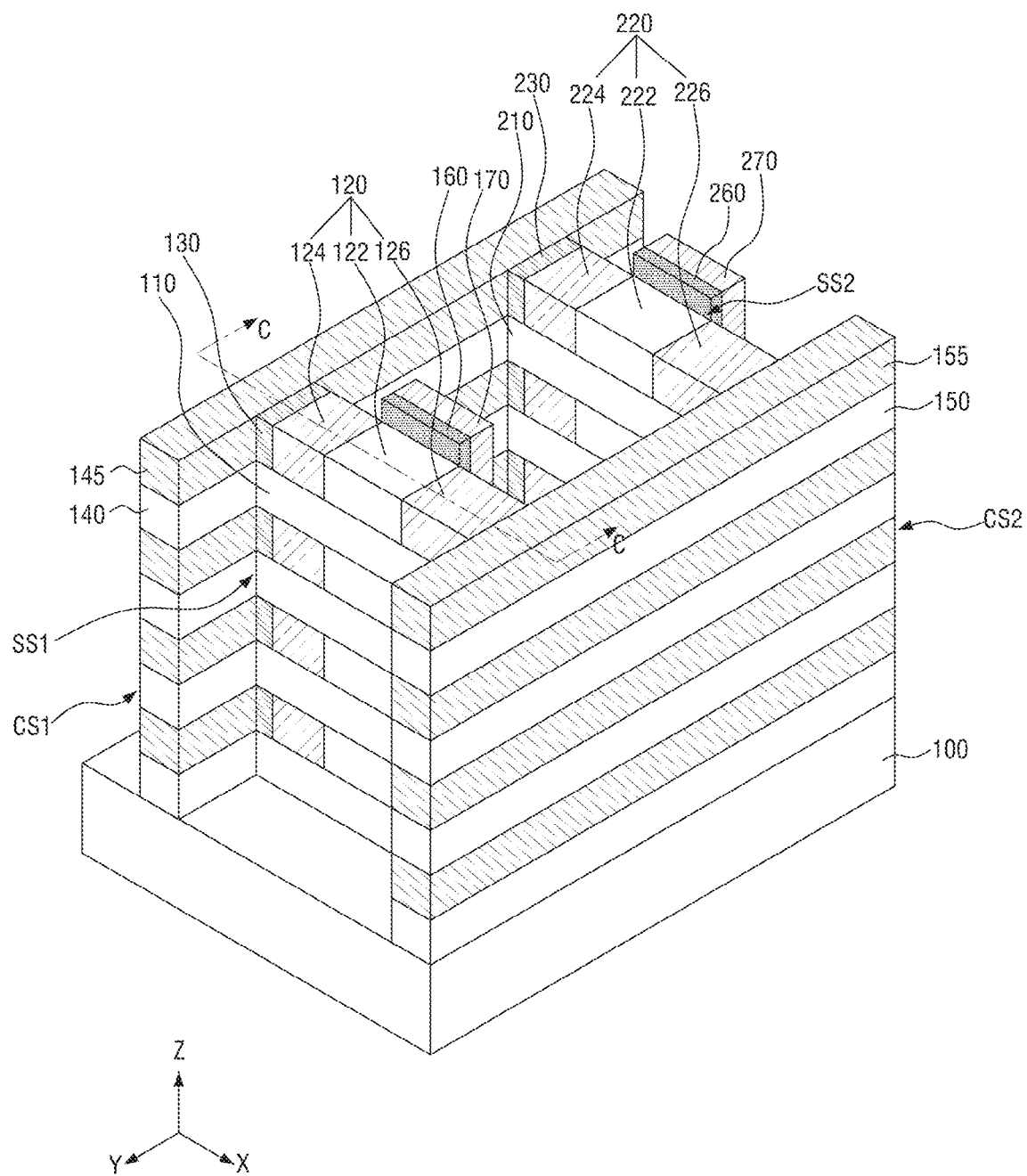
FIG. 6 is a schematic perspective view illustrating a semiconductor device according to an example embodiment.
Figure 7:
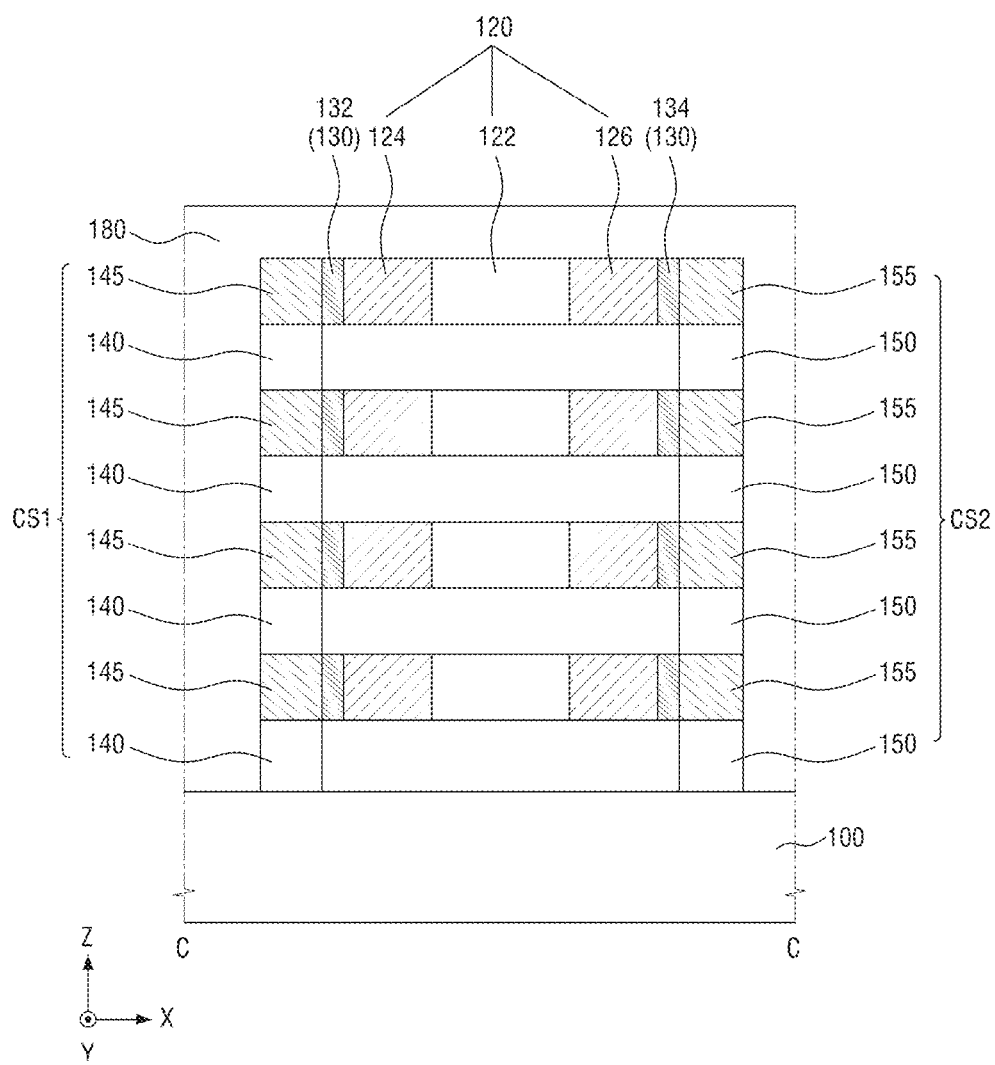
FIG. 7 is a cross-sectional view taken along line C-C of FIG. 6.

FIG. 5 is a circuit diagram illustrating a semiconductor device according to some embodiments. FIG. 6 is a schematic perspective view illustrating a semiconductor device according to some embodiments. FIG. 7 is a cross-sectional view taken along line C-C of FIG. 6. For simplicity of description, a description overlapping with the description with reference to FIGS. 1 to 4 will be briefly given or omitted.

Referring to FIG. 5, in the semiconductor device according to some embodiments, one wiring CL may correspond to one bit line BL.

For example, as illustrated, the plurality of cell transistors CT sharing one bit line BL may share one wiring CL. In some embodiments, each wiring CL may extend in a direction crossing each word line WL.

Referring to FIGS. 6 and 7, the semiconductor device described above with reference to FIG. 5 may be provided on a substrate 100. Specifically, in the semiconductor device according to some embodiments, the other end of the first stacked structure SS1 may be connected to the second wiring structure CS2.

The second wiring structure CS2 may be formed on the substrate 100. The second wiring structure CS2 may be connected to the other end of the first stacked structure SS1. In some embodiments, the second wiring structure CS2 may extend in the second direction Y to be connected to the other end of the first stacked structure SS1 and the other end of the second stacked structure SS2.

The second wiring structure CS2 may include a plurality of wiring patterns vertically arranged. For example, the second wiring structure CS2 may include a plurality of second wiring patterns 155 arranged along the third direction Z.

In some embodiments, the second wiring structure CS2 may include a plurality of fourth insulating patterns 150 and a plurality of second wiring patterns 155 which are alternately stacked on the substrate 100. That is, the plurality of second wiring patterns 155 may be spaced apart from each other by the fourth insulating patterns 150.

The plurality of fourth insulating patterns 150 may include an insulating material. For example, the plurality of fourth insulating patterns 150 may include silicon oxide, but is not limited thereto.

Each second wiring pattern 155 may extend in the second direction Y. Each second wiring pattern 155 may be connected to the other end of each first semiconductor pattern 120 and the other end of each second semiconductor pattern 220. For example, each second wiring pattern 155 may be connected to the second impurity region 126 and the fourth impurity region 226. Each second wiring pattern 155 may correspond to each wiring CL described above with reference to FIG. 5.

Although FIG. 7 illustrates that the bottom surface of each second wiring pattern 155 has the same height as the bottom surface of the first semiconductor pattern 120, a person having skill in the art would recognize the example embodiment is not limited thereto. For example, as long as the second wiring pattern 155 is connected to the second impurity region 126, the bottom surface of the second wiring pattern 155 may be formed to be higher than the bottom surface of the first semiconductor pattern 120 or may be formed to be lower than the bottom surface of the first semiconductor pattern 120.

Figure 8:
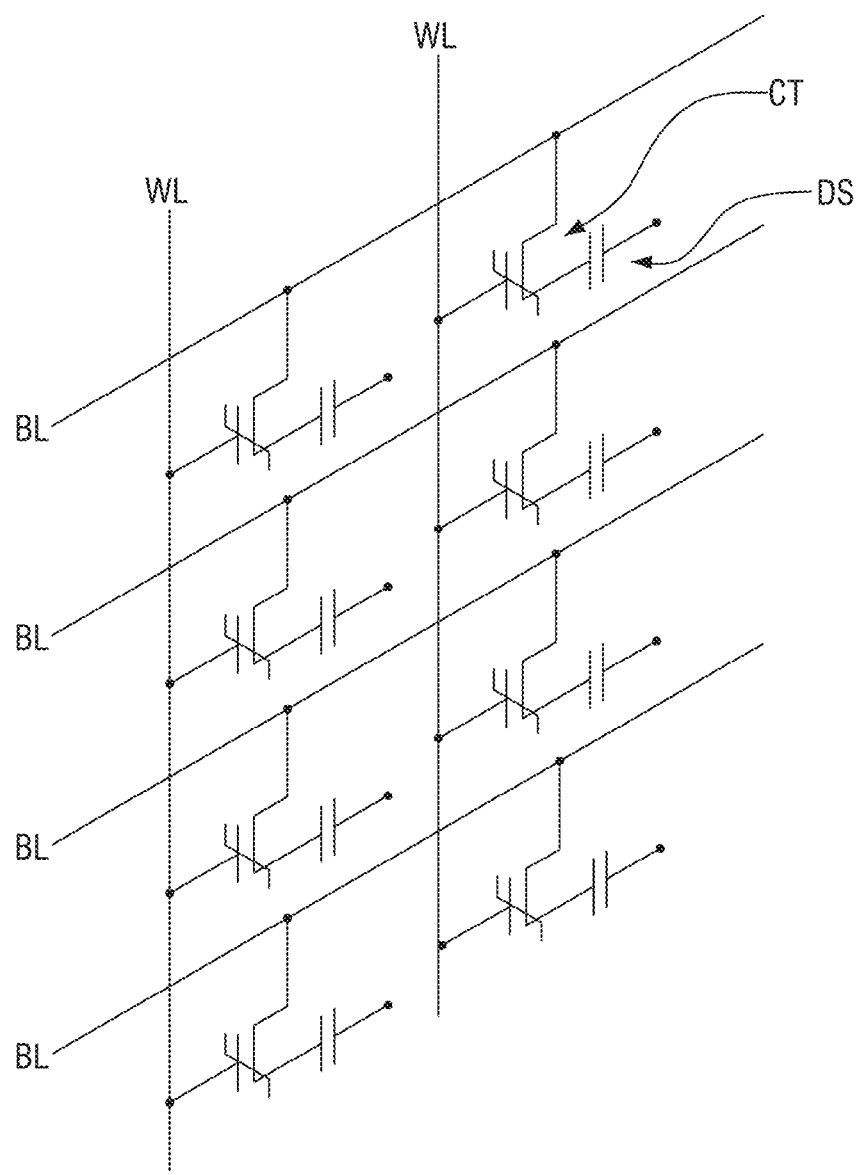
FIG. 8 is a circuit diagram illustrating a semiconductor device according to an example embodiment.
Figure 9:
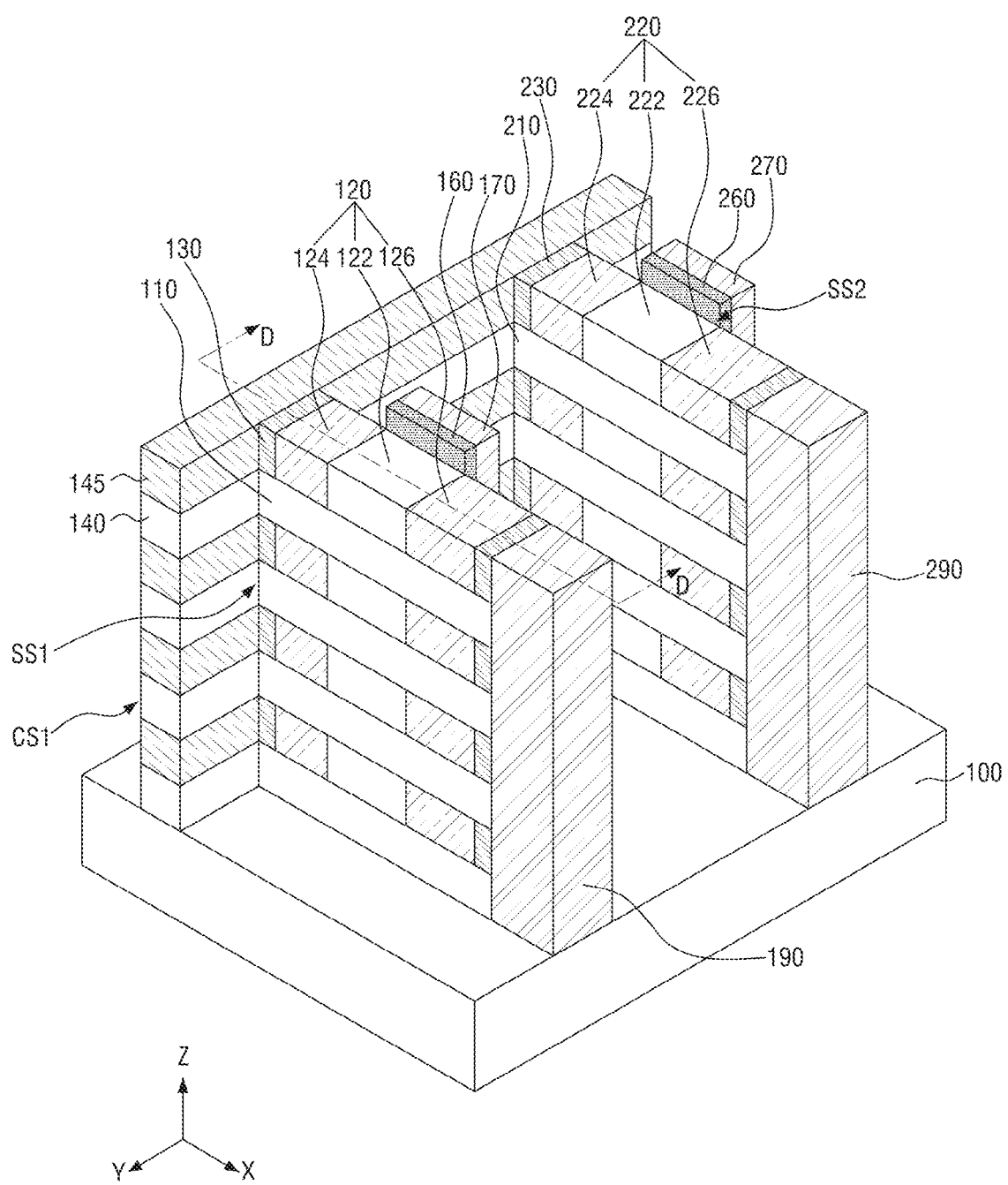
FIG. 9 is a schematic perspective view illustrating a semiconductor device according to an example embodiment.
Figure 10:
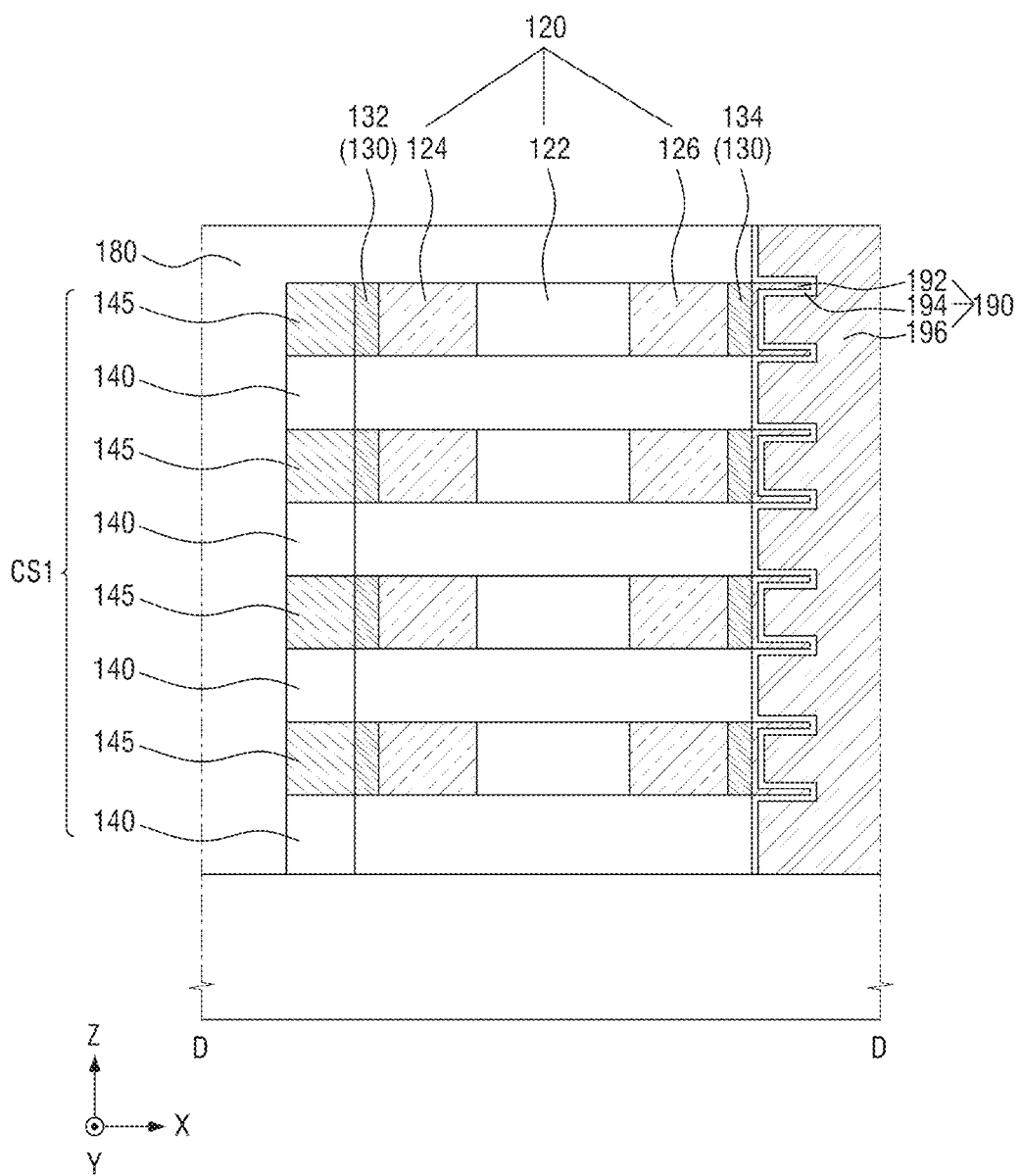
FIG. 10 is a cross-sectional view taken along line D-D of FIG. 9.

FIG. 8 is a circuit diagram illustrating a semiconductor device according to some embodiments. FIG. 9 is a schematic perspective view illustrating a semiconductor device according to some embodiments. FIG. 10 is a cross-sectional view taken along line D-D of FIG. 9. For simplicity of description, a description overlapping with the description with reference to FIGS. 1 to 4 will be briefly given or omitted.

Referring to FIG. 8, in the semiconductor device according to some embodiments, each cell transistor CT may be connected to an information storage element DS.

For example, the drain of each cell transistor CT may be connected to the information storage element DS. The information storage element DS may be, for example, a capacitor. The information storage element DS may be controlled by each cell transistor CT to store data.

Referring to FIGS. 9 and 10, the semiconductor device described above with reference to FIG. 8 may be provided on the substrate 100. Specifically, in the semiconductor device according to some embodiments, the other end of the first stacked structure SS1 may be connected to a first capacitor structure 190.

For example, the first stacked structure SS1 may be interposed between the first wiring structure CS1 and the first capacitor structure 190 to be connected to the first wiring structure CS1 and the first capacitor structure 190.

The first capacitor structure 190 may include a first electrode 192, a capacitor dielectric layer 194 and a second electrode 196. The first capacitor structure 190 may store charges in the capacitor dielectric layer 194 using a potential difference generated between the first electrode 192 and the second electrode 196.

The first electrode 192 may be connected to the second impurity region 126 of each first semiconductor pattern 120. In some embodiments, the second silicide layer 134 may be interposed between the second impurity region 126 and the first electrode 192. For example, the first electrode 192 may have a cylindrical shape, but is not limited thereto.

The capacitor dielectric layer 194 may be formed on the first electrode 192. For example, the capacitor dielectric layer 194 may extend along the profile of the first electrode 192.

The second electrode 196 may be formed on the capacitor dielectric layer 194. The second electrode 196 may be spaced apart from the first electrode 192 by the capacitor dielectric layer 194. That is, the capacitor dielectric layer 194 may be interposed between the first electrode 192 and the second electrode 196.

The first electrode 192 and the second electrode 196 may include a conductive material, for example, but not limited to, doped polysilicon, metal, metal-semiconductor compound, metal nitride, and/or a combination thereof. In addition, the capacitor dielectric layer 194 may include, for example, silicon oxide or a high-k material having a higher dielectric constant than that of silicon oxide, but is not limited thereto.

In some embodiments, the other end of the second stacked structure SS2 may be connected to a second capacitor structure 290. For example, the second stacked structure SS2 may be interposed between the first wiring structure CS1 and the second capacitor structure 290 to be connected to the first wiring structure CS1 and the second capacitor structure 290.

Since the second capacitor structure 290 may be similar to the first capacitor structure 190, a detailed description thereof will be omitted below.

Figure 11:
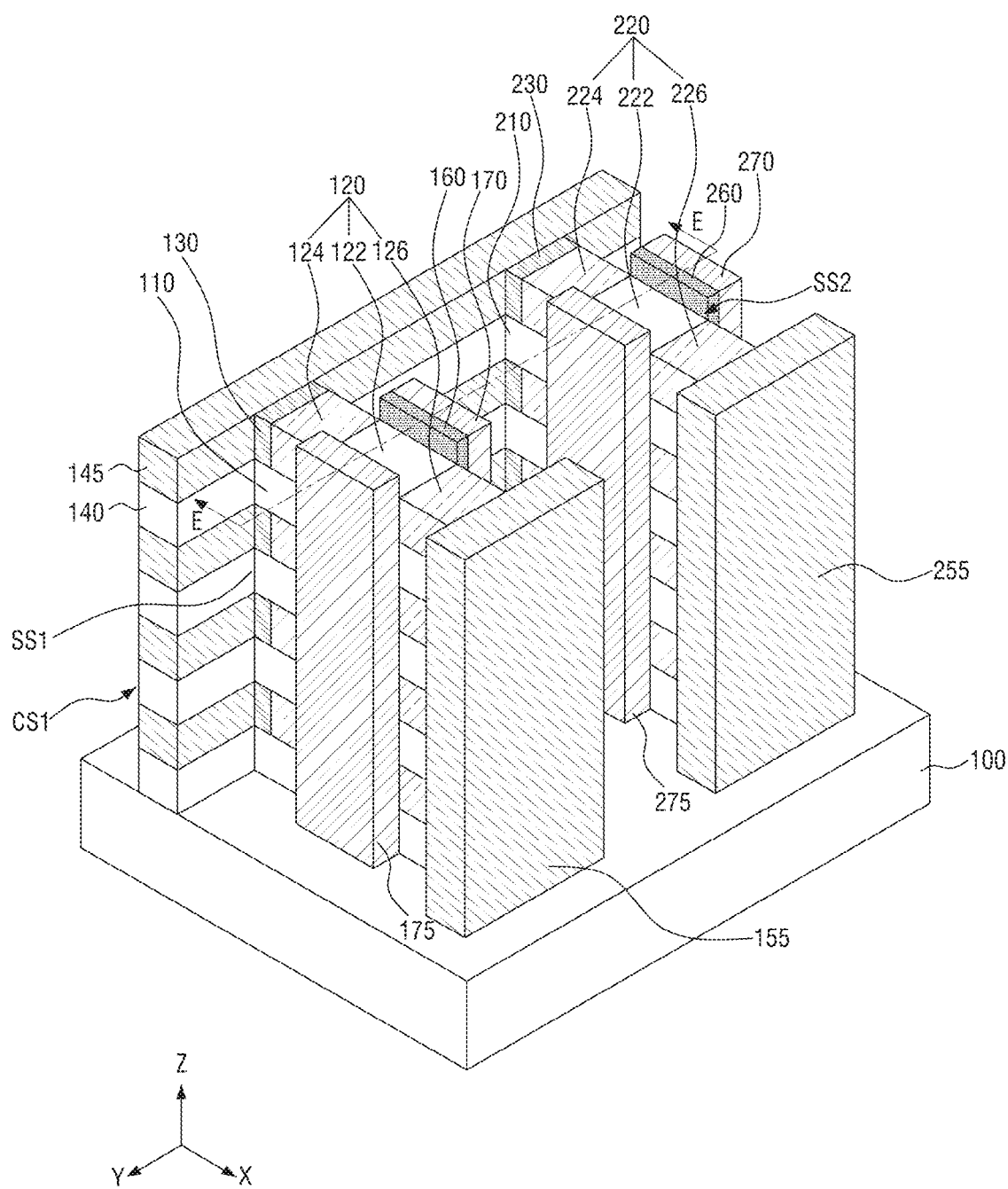
FIG. 11 is a schematic perspective view illustrating a semiconductor device according to an example embodiment.
Figure 12:
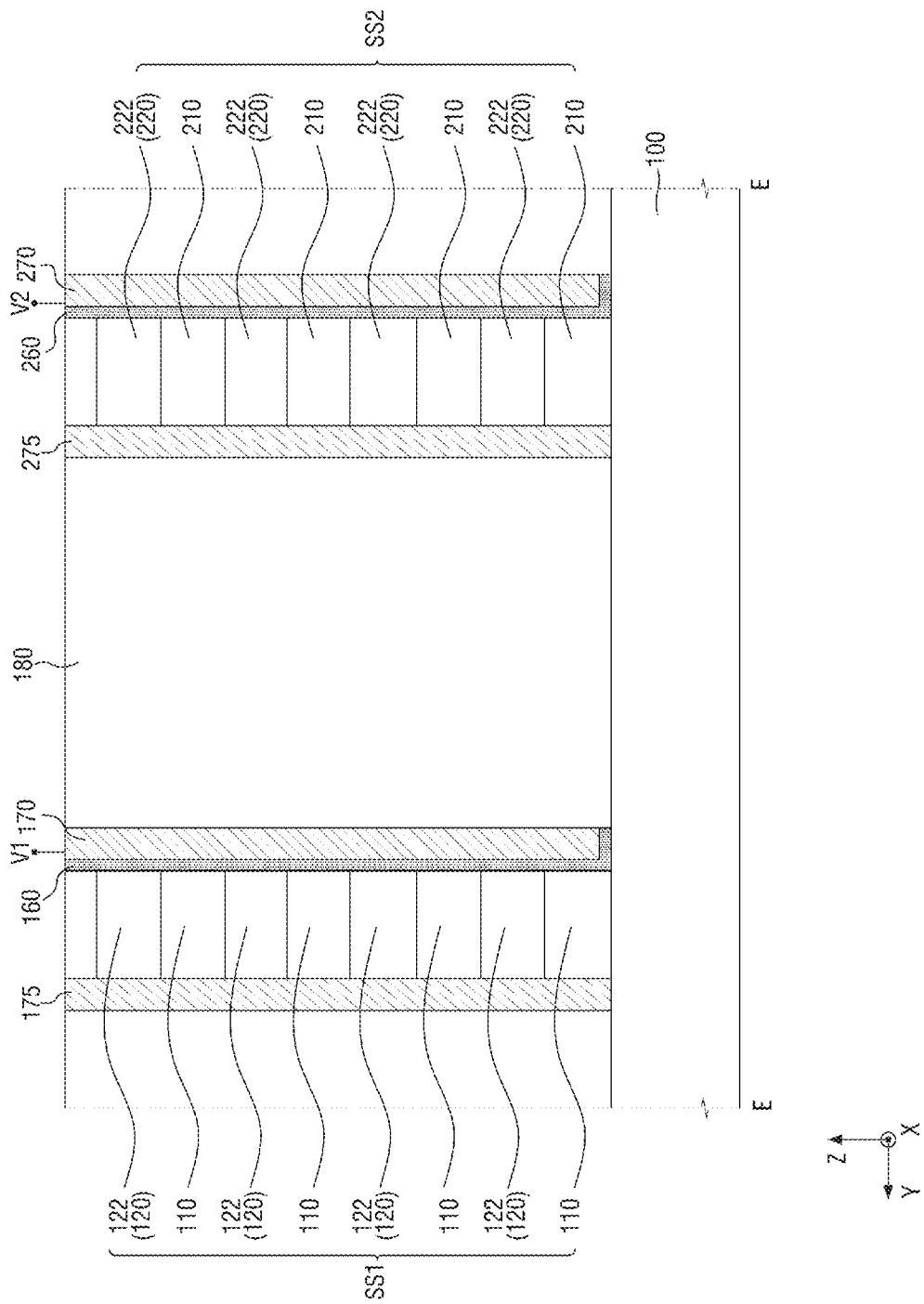
FIG. 12 is a cross-sectional view taken along line E-E of FIG. 11.

FIG. 11 is a schematic perspective view illustrating a semiconductor device according to some embodiments. FIG. 12 is a cross-sectional view taken along line E-E of FIG. 11. For simplicity of description, a description overlapping with the description with reference to FIGS. 1 to 4 will be briefly given or omitted.

Referring to FIGS. 11 and 12, a semiconductor device according to some embodiments may further include a third conductive pattern 175.

The third conductive pattern 175 may be formed on the other side surface of the first stacked structure SS1. The third conductive pattern 175 and the first stacked structure SS1 may be arranged along the second direction Y. That is, the first stacked structure SS1 may be interposed between the first conductive pattern 170 and the third conductive pattern 175.

The third conductive pattern 175 may extend in the third direction Z. For example, the third conductive pattern 175 may extend along the side surfaces of the plurality of first insulating patterns 110 and the side surfaces of the plurality of first semiconductor patterns 120. The third conductive pattern 175 may have, for example, a line shape, a bar shape, or a pillar shape extending in the third direction Z, but is not limited thereto.

The third conductive pattern 175 may cross the first channel region 122 of each first semiconductor pattern 120. For example, the third conductive pattern 175 may extend along the side surface of the first channel region 122 of each first semiconductor pattern 120.

The semiconductor device according to some embodiments may further include a fourth conductive pattern 275.

The fourth conductive pattern 275 may be formed on the other side surface of the second stacked structure SS2. The fourth conductive pattern 275 and the second stacked structure SS2 may be arranged along the second direction Y. That is, the second stacked structure SS2 may be interposed between the second conductive pattern 270 and the fourth conductive pattern 275.

The fourth conductive pattern 275 may extend in the third direction Z. For example, the fourth conductive pattern 275 may extend along the side surfaces of the plurality of second insulating patterns 210 and the side surfaces of the plurality of second semiconductor patterns 220. The fourth conductive pattern 275 may have, for example, a line shape, a bar shape, or a pillar shape extending in the third direction Z, but is not limited thereto.

The fourth conductive pattern 275 may cross the second channel region 222 of each second semiconductor pattern 220. For example, the fourth conductive pattern 275 may extend along the side surface of the second channel region 222 of each second semiconductor pattern 220.

In some embodiments, the first to fourth conductive patterns 170, 270, 175 and 275 may overlap each other in the second direction Y. For example, in plan view, the first to fourth conductive patterns 170, 270, 175 and 275 may be arranged in a row along the second direction Y.

The third conductive pattern 175 and the fourth conductive pattern 275 may include a conductive material. For example, the third conductive pattern 175 and the fourth conductive pattern 275 may include at least one selected from the group consisting of a doped semiconductor material, conductive metal nitride, metal, a metal-semiconductor compound and a combination thereof, but the present disclosure is not limited thereto. In some embodiments, the first to fourth conductive patterns 170, 270, 175 and 275 may be formed at the same level.

In some embodiments, the third conductive pattern 175 may be in contact with the side surface of the first channel region 122 of each first semiconductor pattern 120, and the fourth conductive pattern 275 may be in contact with the side surface of the second channel region 222 of each second semiconductor pattern 220. Accordingly, the third conductive pattern 175 may be electrically connected to each first semiconductor pattern 120, and the fourth conductive pattern 275 may be electrically connected to each second semiconductor pattern 220. The third conductive pattern 175 may function as a body contact of the cell transistor including the first semiconductor pattern 120, and the fourth conductive pattern 275 may function as a body contact of the cell transistor including the second semiconductor pattern 220. For example, a floating body effect may not the first semiconductor pattern 120 and the second semiconductor pattern 220.

Figure 13:
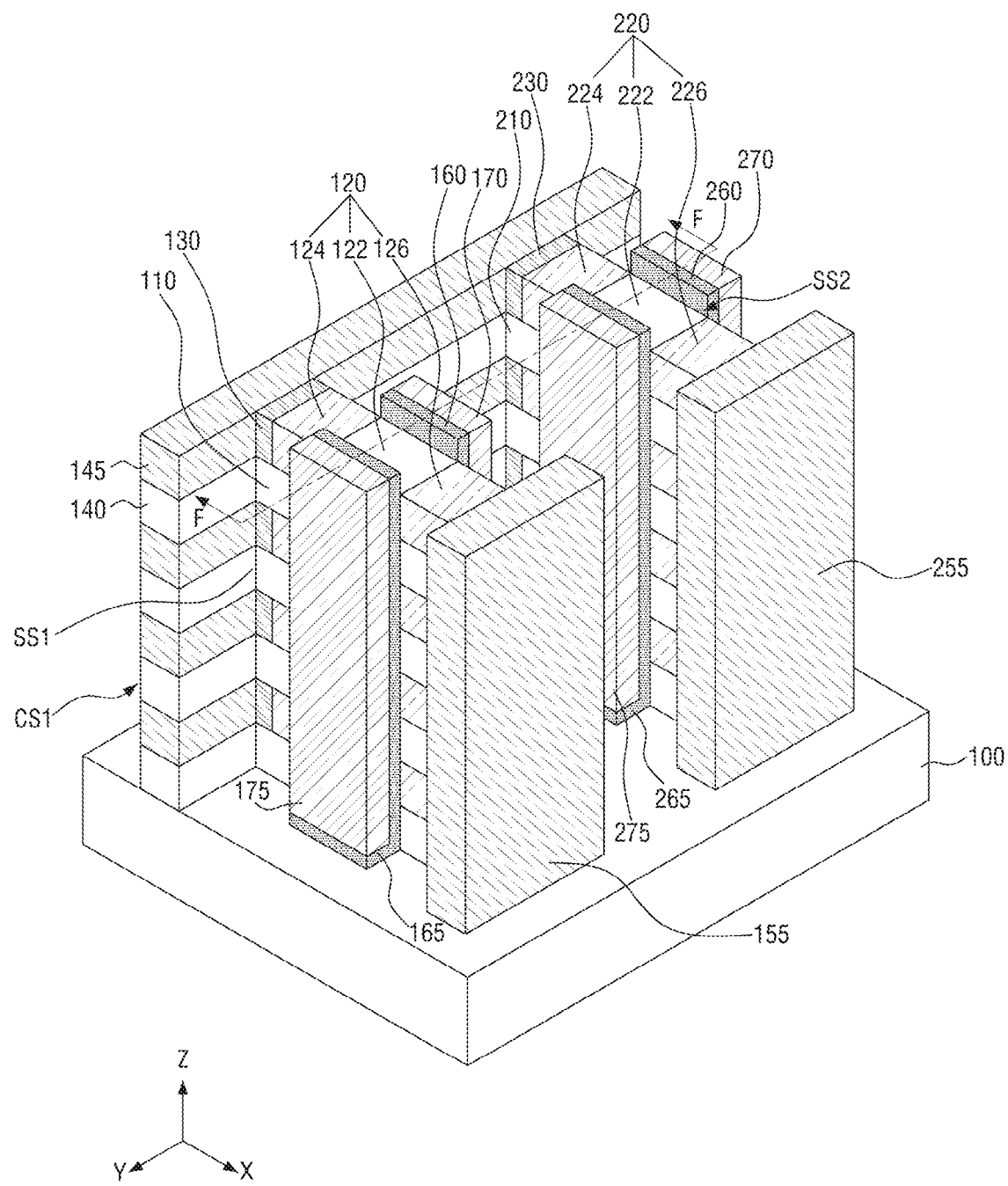
FIG. 13 is a schematic perspective view illustrating a semiconductor device according to an example embodiment.

FIG. 13 is a schematic perspective view illustrating a semiconductor device according to some embodiments. FIGS. 14 to 17 are various cross-sectional views taken along line F-F of FIG. 13. For simplicity of description, a description overlapping with the description with reference to FIGS. 1 to 4, 11 and 12 will be briefly given or omitted.

Figure 14:
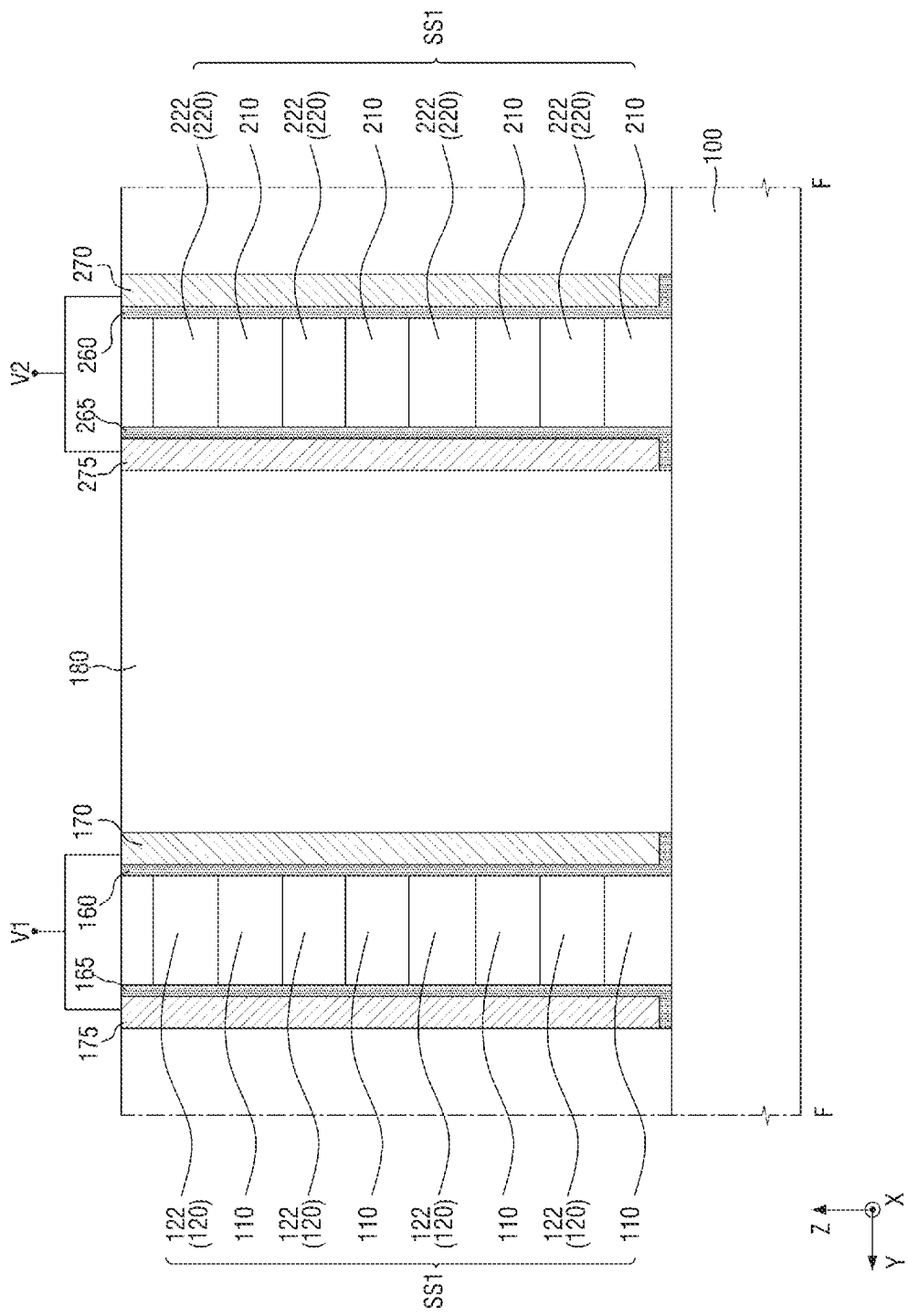
FIGS. 14 to 17 are various cross-sectional views taken along line F-F of FIG. 13.

Referring to FIGS. 13 and 14, a semiconductor device according to some embodiments may further include a third ferroelectric layer 165.

The third ferroelectric layer 165 may be interposed between the first stacked structure SS1 and the third conductive pattern 175. That is, the third ferroelectric layer 165 may be formed on the other side surface of the first stacked structure SS1. The third ferroelectric layer 165 may extend along the third direction Z. For example, the third ferroelectric layer 165 may extend along the side surfaces of the plurality of first insulating patterns 110 and the side surfaces of the plurality of first semiconductor patterns 120.

The semiconductor device according to some embodiments may further include a fourth ferroelectric layer 265.

The fourth ferroelectric layer 265 may be interposed between the second stacked structure SS2 and the fourth conductive pattern 275. That is, the fourth ferroelectric layer 265 may be formed on the other side surface of the second stacked structure SS2. The fourth ferroelectric layer 265 may extend along the third direction Z. For example, the fourth ferroelectric layer 265 may extend along the side surfaces of the plurality of second insulating patterns 210 and the side surfaces of the plurality of second semiconductor patterns 220.

Since the shape of the third ferroelectric layer 165 and the shape of the fourth ferroelectric layer 265 may be similar to the shape of the first ferroelectric layer 160 and the shape of the second ferroelectric layer 260, a detailed description thereof will be omitted below.

In some embodiments, the first to fourth ferroelectric layers 160, 260, 165 and 265 may overlap each other in the second direction Y. For example, in plan view, the first to fourth ferroelectric layers 160, 260, 165 and 265 may be arranged in a row along the second direction Y.

Each of the third ferroelectric layer 165 and the fourth ferroelectric layer 265 may include ferroelectric materials. For example, the third ferroelectric layer 165 and the fourth ferroelectric layer 265 may include ferroelectrics such as barium titanate ($BaTiO_3$), lead zirconate titanate ($PbZrTiO_3$, PZT), strontium bismuth tantalate ($SrBi_2Ta_2O_9$, SBT), bismuth iron oxide ($BiFeO_3$, BFO) and hafnium oxide ($HfO_2$), but the present disclosure is not limited thereto. In some embodiments, the first to fourth ferroelectric layers 160, 260, 165 and 265 may be formed at the same level.

In some embodiments, the first conductive pattern 170 and the third conductive pattern 175 may be the gate electrodes of the cell transistors including the first semiconductor patterns 120. For example, when the cell transistor including the first semiconductor pattern 120 is turned on, the first gate voltage V1 may be applied to the first conductive pattern 170 and the third conductive pattern 175.

In some embodiments, the second conductive pattern 270 and the fourth conductive pattern 275 may be the gate electrodes of the cell transistors including the second semiconductor patterns 220. For example, when the cell transistor including the second semiconductor pattern 220 is turned on, the second gate voltage V2 may be applied to the second conductive pattern 270 and the fourth conductive pattern 275.

Accordingly, the semiconductor device according to some embodiments may implement a multi-gate transistor to improve current control capability.

Figure 15:
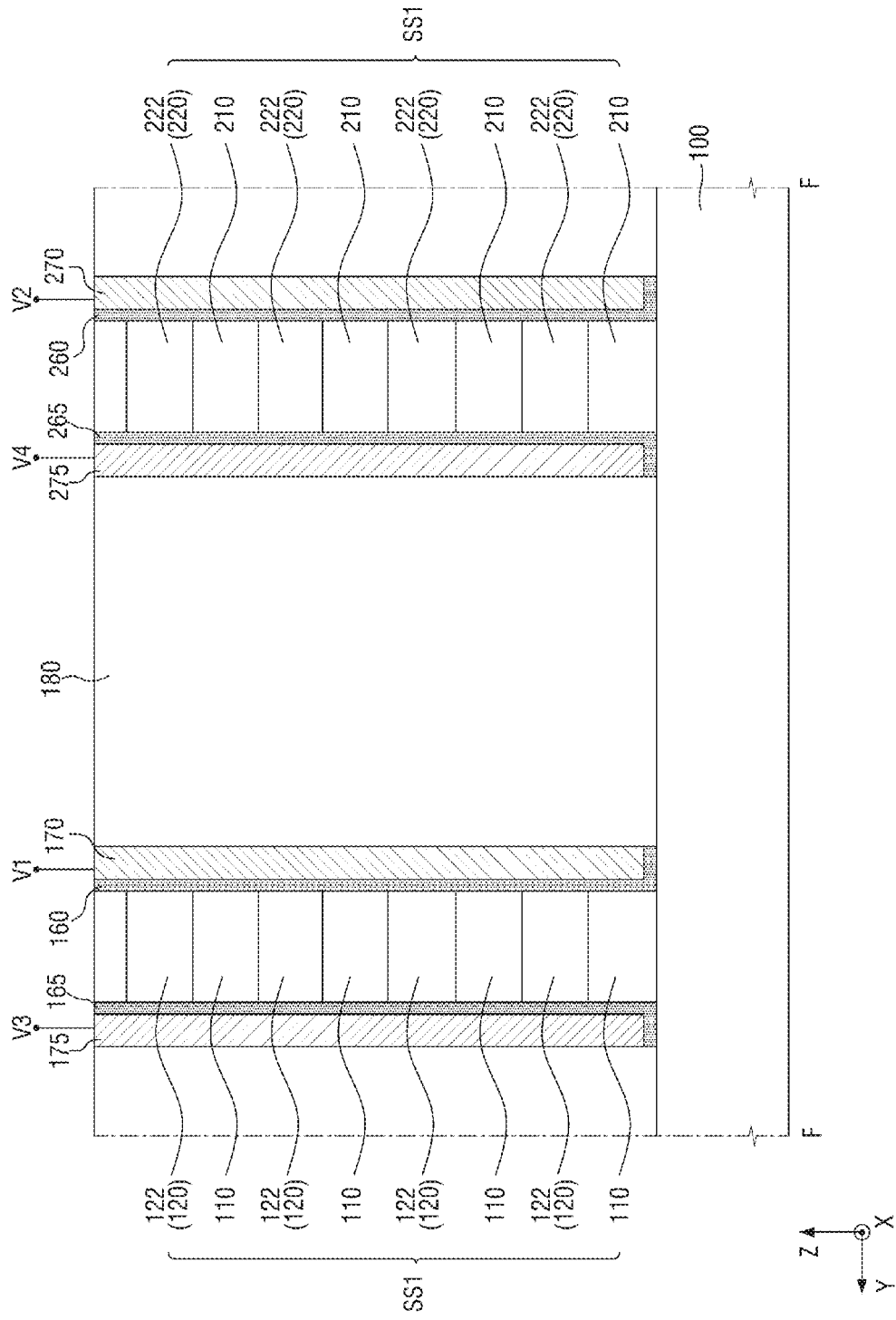

Referring to FIGS. 13 and 15, in the semiconductor device according to some embodiments, different gate voltages may be applied to the first conductive pattern 170 and the third conductive pattern 175.

For example, when the cell transistor including the first semiconductor pattern 120 is turned on, the first gate voltage V1 may be applied to the first conductive pattern 170. In this case, a third gate voltage V3 different from the first gate voltage V1 may be applied to the third conductive pattern 175.

Further, in the semiconductor device according to some embodiments, different gate voltages may be applied to the second conductive pattern 270 and the fourth conductive pattern 275.

For example, when the cell transistor including the second semiconductor pattern 220 is turned on, the second gate voltage V2 may be applied to the second conductive pattern 270, and a fourth gate voltage V4 different from the second gate voltage V2 may be applied to the fourth conductive pattern 275.

A threshold voltage $V_{th}$ of the transistor may vary depending on the voltage applied to the gate electrode. That is, the threshold voltage of the cell transistor including the first semiconductor pattern 120 may be adjusted according to the first gate voltage V1 and the third gate voltage V3. Further, the threshold voltage of the cell transistor including the second semiconductor pattern 220 may be adjusted according to the second gate voltage V2 and the fourth gate voltage V4.

Figure 16:
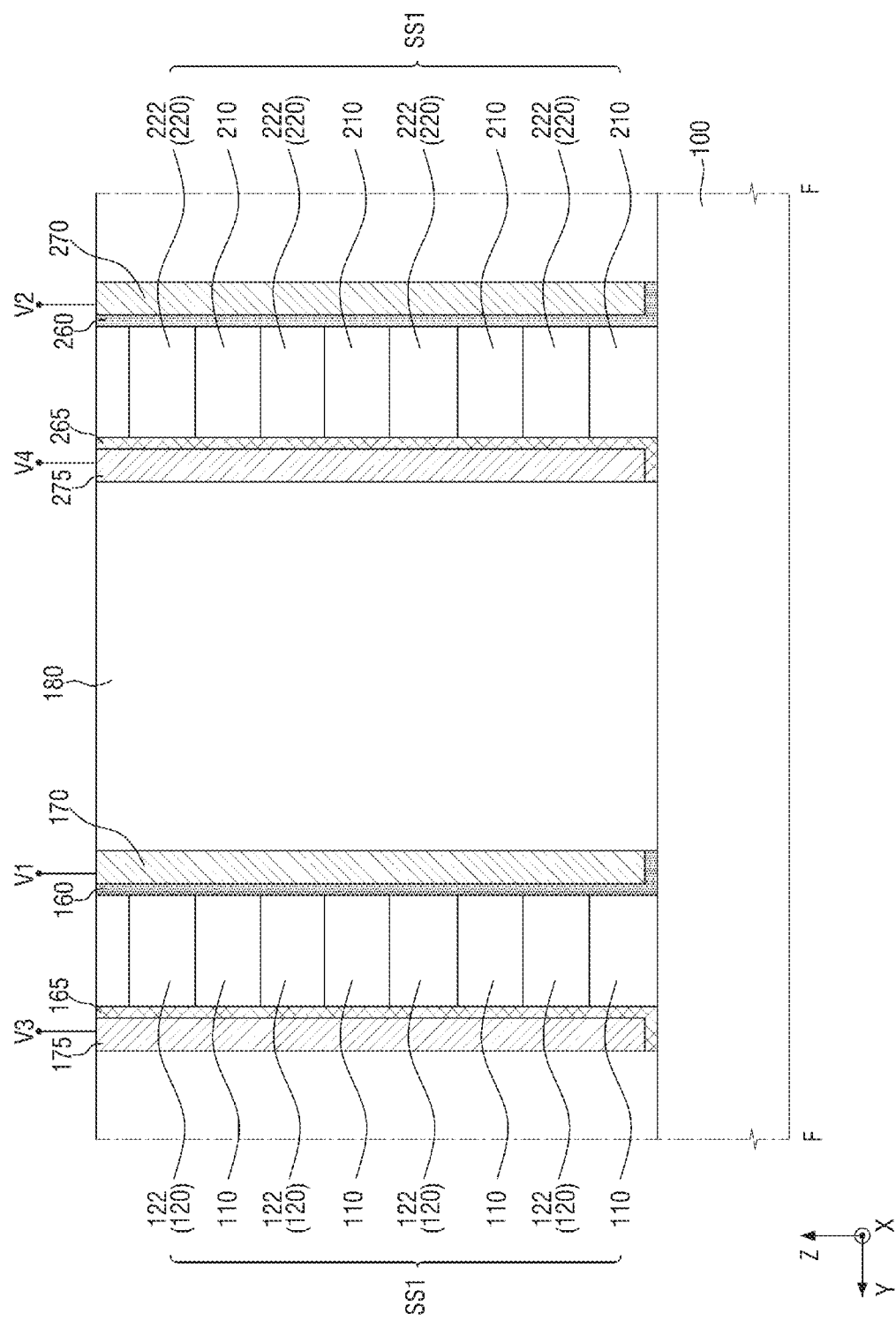

Referring to FIGS. 13 and 16, in the semiconductor device according to some embodiments, the first ferroelectric layer 160 and the third ferroelectric layer 165 may include different materials.

For example, the first ferroelectric layer 160 may include a first ferroelectric material, and the third ferroelectric layer 165 may include a third ferroelectric material different from the first ferroelectric material.

In the semiconductor device according to some embodiments, the second ferroelectric layer 260 and the fourth ferroelectric layer 265 may include different materials.

For example, the second ferroelectric layer 260 may include a second ferroelectric, and the fourth ferroelectric layer 265 may include a fourth ferroelectric different from the second ferroelectric.

The threshold voltage of a FeFET may vary depending on the type of ferroelectric layer included in the ferroelectric field effect transistor. That is, the threshold voltage of the cell transistor including the first semiconductor pattern 120 may be adjusted according to the materials included in the first ferroelectric layer 160 and the third ferroelectric layer 165. Further, the threshold voltage of the cell transistor including the second semiconductor pattern 220 may be adjusted according to the materials included in the second ferroelectric layer 260 and the fourth ferroelectric layer 265.

Figure 17:
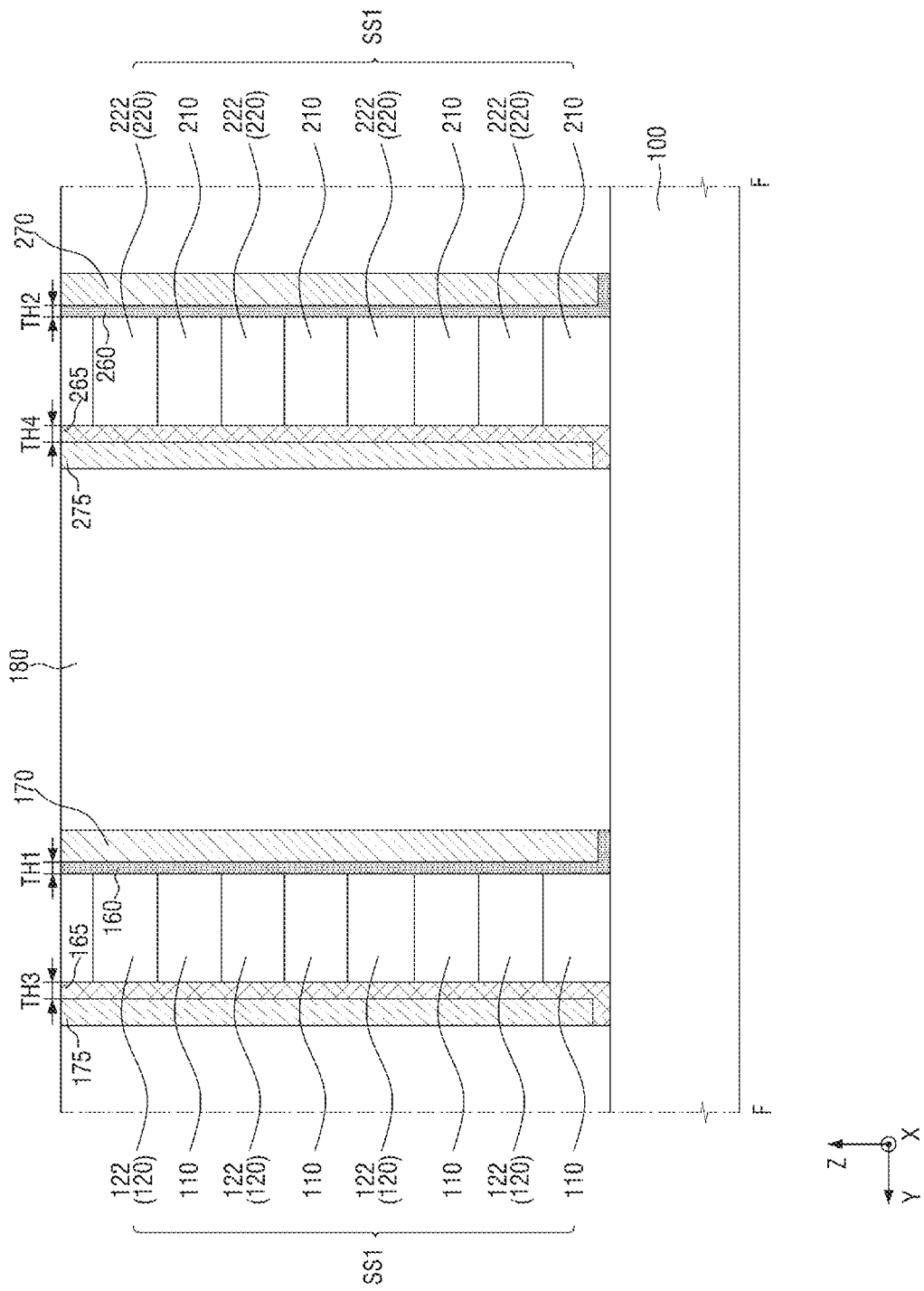

Referring to FIGS. 13 and 17, in the semiconductor device according to some embodiments, the first ferroelectric layer 160 and the third ferroelectric layer 165 may have different thicknesses.

For example, the first ferroelectric layer 160 may have a first thickness TH1, and the third ferroelectric layer 165 may have a third thickness TH3 different from the first thickness TH1. Although it is illustrated that the third thickness TH3 is larger than the first thickness TH1, a person having skill in the art would recognize the example embodiment is not limited thereto. For example, the third thickness TH3 may be smaller than the first thickness TH1.

In the semiconductor device according to some embodiments, the second ferroelectric layer 260 and the fourth ferroelectric layer 265 may have different thicknesses.

For example, the second ferroelectric layer 260 may have a second thickness TH2, and the fourth ferroelectric layer 265 may have a fourth thickness TH4 different from the second thickness TH2. Although it is illustrated that the fourth thickness TH4 is larger than the second thickness TH2, a person having skill in the art would recognize the example embodiment is not limited thereto. For example, the fourth thickness TH4 may be smaller than the second thickness TH2.

The threshold voltage of a FeFET may vary depending on the thickness of a ferroelectric layer included in the ferroelectric field effect transistor. That is, the threshold voltage of the cell transistor including the first semiconductor pattern 120 may be adjusted according to the thicknesses of the first ferroelectric layer 160 and the third ferroelectric layer 165. In addition, the threshold voltage of the cell transistor including the second semiconductor pattern 220 may be adjusted according to the thicknesses of the second ferroelectric layer 260 and the fourth ferroelectric layer 265.

Figure 18:
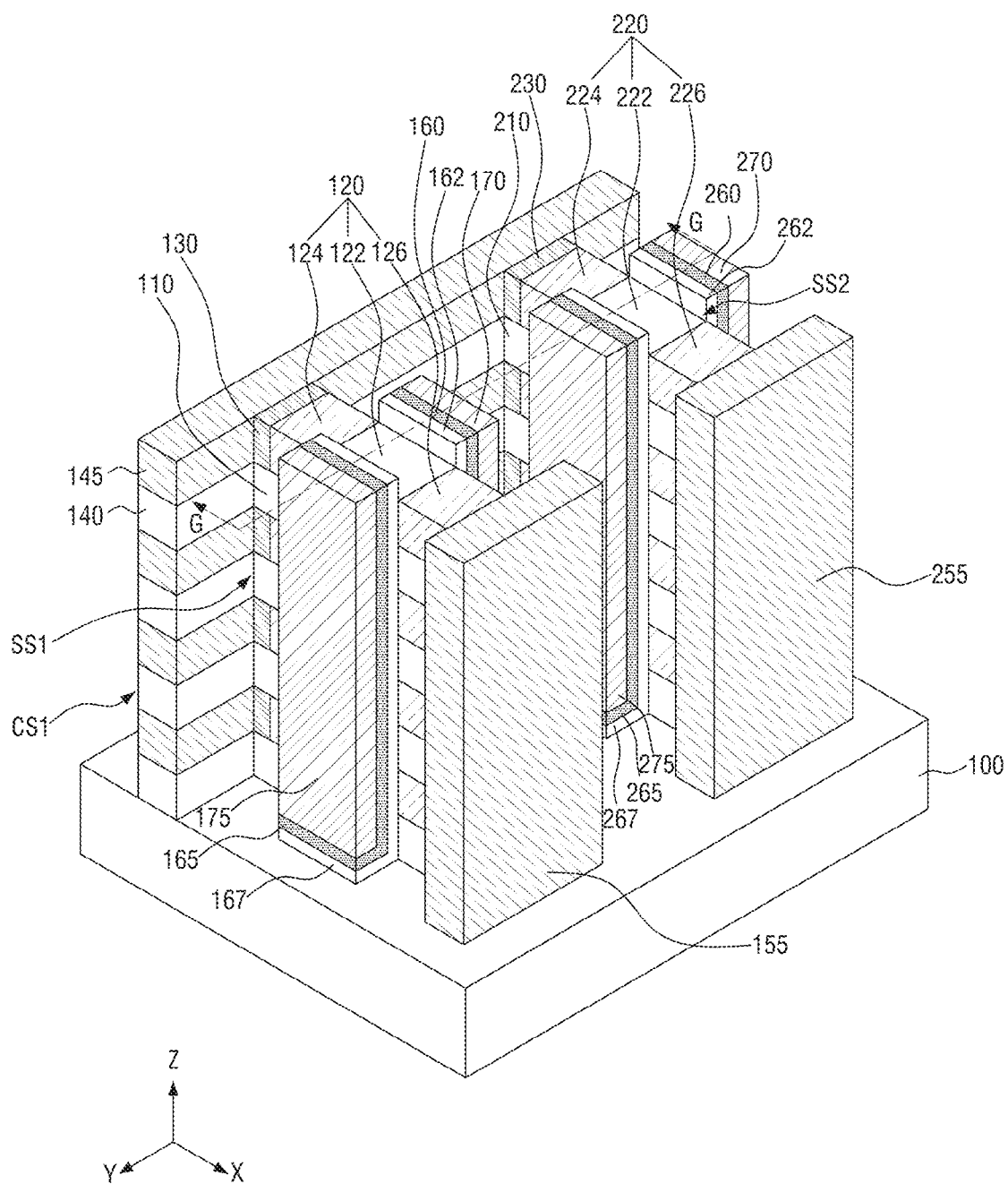
FIG. 18 is a schematic perspective view illustrating a semiconductor device according to an example embodiment.
Figure 19:
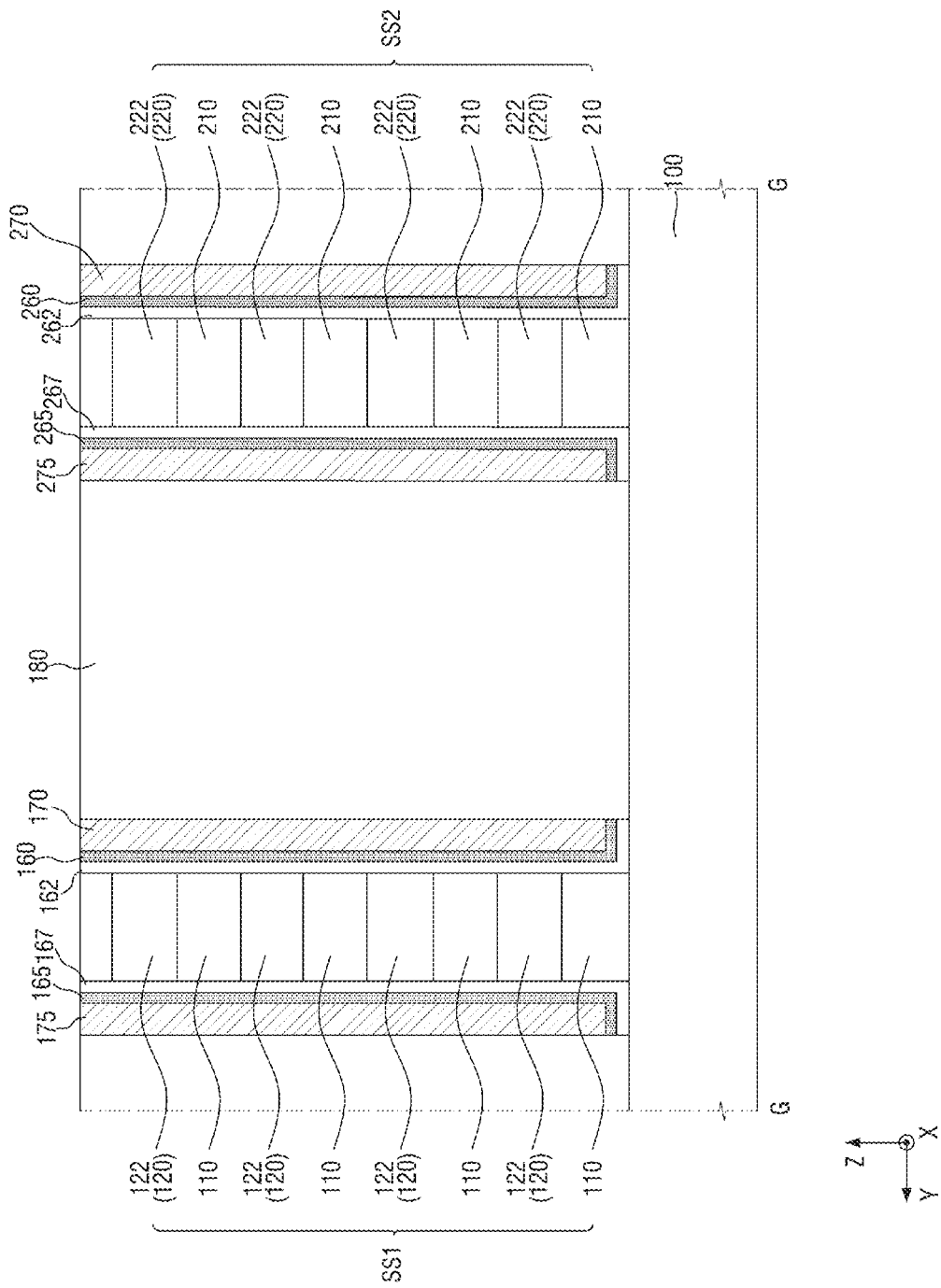
FIGS. 19 and 20 are various cross-sectional views taken along line G-G of FIG. 18.
Figure 20:
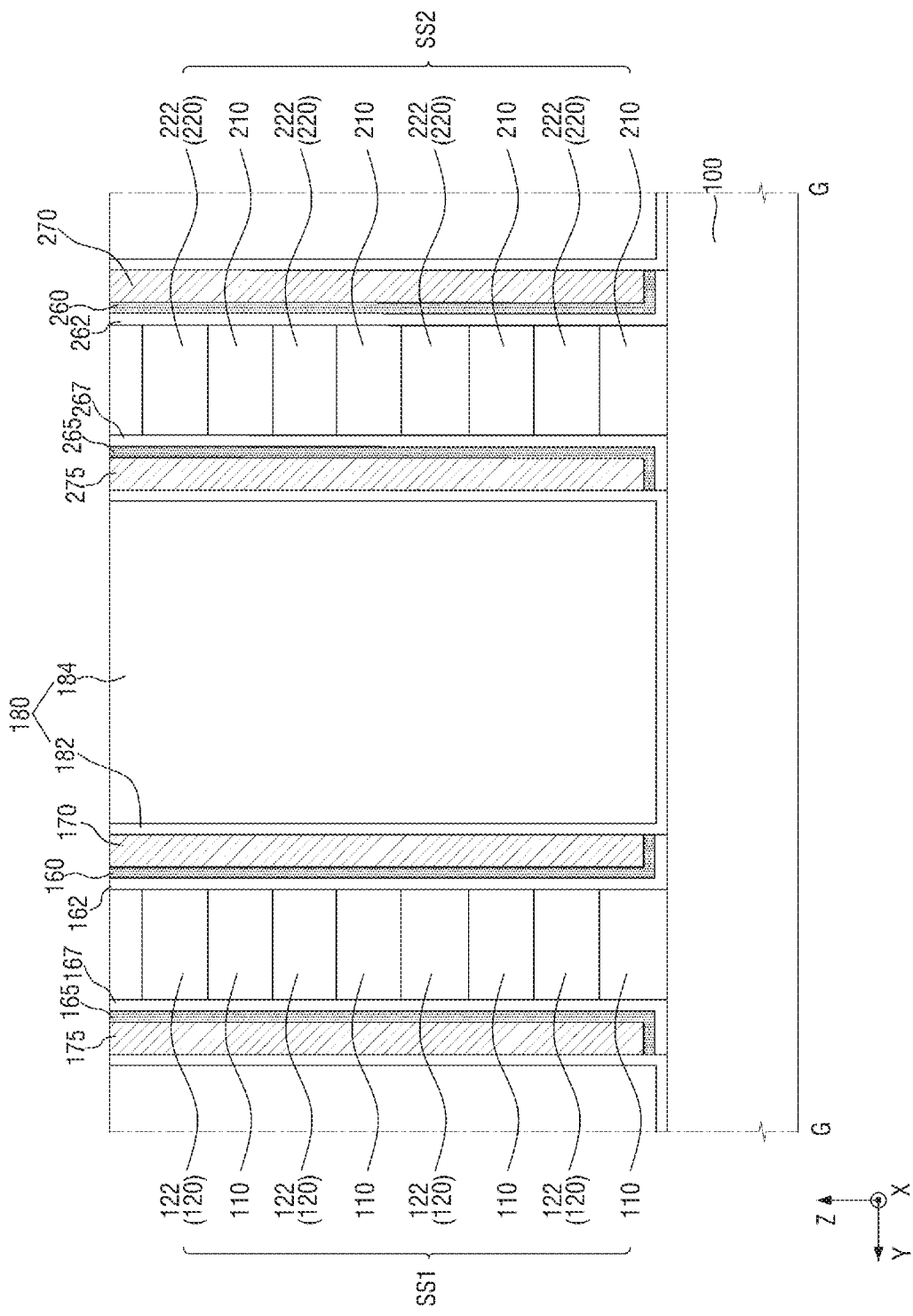

FIG. 18 is a schematic perspective view illustrating a semiconductor device according to some embodiments. FIGS. 19 and 20 are various cross-sectional views taken along line G-G of FIG. 18. For simplicity of description, a description overlapping with the description with reference to FIGS. 1 to 4 and 13 to 17 will be briefly given or omitted.

Referring to FIGS. 18 and 19, a semiconductor device according to some embodiments may further include first to fourth gate dielectric layers 162, 262, 167 and 267.

The first gate dielectric layer 162 may be interposed between the first stacked structure SS1 and the first ferroelectric layer 160. The second gate dielectric layer 262 may be interposed between the second stacked structure SS2 and the second ferroelectric layer 260. The first gate dielectric layer 162 and the second gate dielectric layer 262 may extend along the third direction Z. For example, the first gate dielectric layer 162 may extend along the side surfaces of the plurality of first insulating patterns 110 and the side surfaces of the plurality of first semiconductor patterns 120. Further, for example, the second gate dielectric layer 262 may extend along the side surfaces of the plurality of second insulating patterns 210 and the side surfaces of the plurality of second semiconductor patterns 220.

The third gate dielectric layer 167 may be interposed between the first stacked structure SS1 and the third ferroelectric layer 165. The fourth gate dielectric layer 267 may be interposed between the second stacked structure SS2 and the fourth ferroelectric layer 265. The third gate dielectric layer 167 and the fourth gate dielectric layer 267 may extend along the third direction Z. For example, the third gate dielectric layer 167 may extend along the side surfaces of the plurality of first insulating patterns 110 and the side surfaces of the plurality of first semiconductor patterns 120, and the fourth gate dielectric layer 267 may extend along the side surfaces of the plurality of second insulating patterns 210 and the side surfaces of the plurality of second semiconductor patterns 220.

In some embodiments, the first to fourth gate dielectric layers 162, 262, 167 and 267 may overlap each other in the second direction Y. For example, in plan view, the first to fourth gate dielectric layers 162, 262, 167 and 267 may be arranged in a row along the second direction Y.

In some embodiments, a portion of the first gate dielectric layer 162 may be interposed between the substrate 100 and the first ferroelectric layer 160, and a portion of the second gate dielectric layer 262 may be interposed between the substrate 100 and the second ferroelectric layer 260. For example, the first ferroelectric layer 160 may extend along the profile of the first gate dielectric layer 162, and the second ferroelectric layer 260 may extend along the profile of the second gate dielectric layer 262.

Further, in some embodiments, a portion of the third gate dielectric layer 167 may be interposed between the substrate 100 and the third ferroelectric layer 165, and a portion of the fourth gate dielectric layer 267 may be interposed between the substrate 100 and the fourth ferroelectric layer 265. For example, the third ferroelectric layer 165 may extend along the profile of the third gate dielectric layer 167, and the fourth ferroelectric layer 265 may extend along the profile of the fourth gate dielectric layer 267.

In some embodiments, the width of the first gate dielectric layer 162 may be the same as the width of the first ferroelectric layer 160, and the width of the second gate dielectric layer 262 may be the same as the width of the second ferroelectric layer 260. Further, in some embodiments, the width of the third gate dielectric layer 167 may be the same as the width of the third ferroelectric layer 165, and the width of the fourth gate dielectric layer 267 may be the same as the width of the fourth ferroelectric layer 265. The term "width" as used herein refers to a width in the first direction X.

The first to fourth gate dielectric layers 162, 262, 167 and 267 may include, for example, at least one of silicon oxide, silicon oxynitride, silicon nitride, or a high-k material having a higher dielectric constant than silicon oxide, but the present disclosure is not limited thereto. Alternatively, for example, the first to fourth gate dielectric layers 162, 262, 167 and 267 may include ferroelectrics.

Referring to FIGS. 18 and 20, in the semiconductor device according to some embodiments, the interlayer insulating layer 180 may be a multilayer. For example, the interlayer insulating layer 180 may include a first insulating layer 182 and a second insulating layer 184.

In some embodiments, the first insulating layer 182 may conformally extend along the upper surface of the substrate 100, the side surface of the first stacked structure SS1 and the side surface of the second stacked structure SS2. The second insulating layer 184 may be formed on the first insulating layer 182. In some embodiments, the second insulating layer 184 may be a filling insulating layer filling the space on the first insulating layer 182.

The first insulating layer 182 and the second insulating layer 184 may include the same material or may include different materials.

Figure 21:
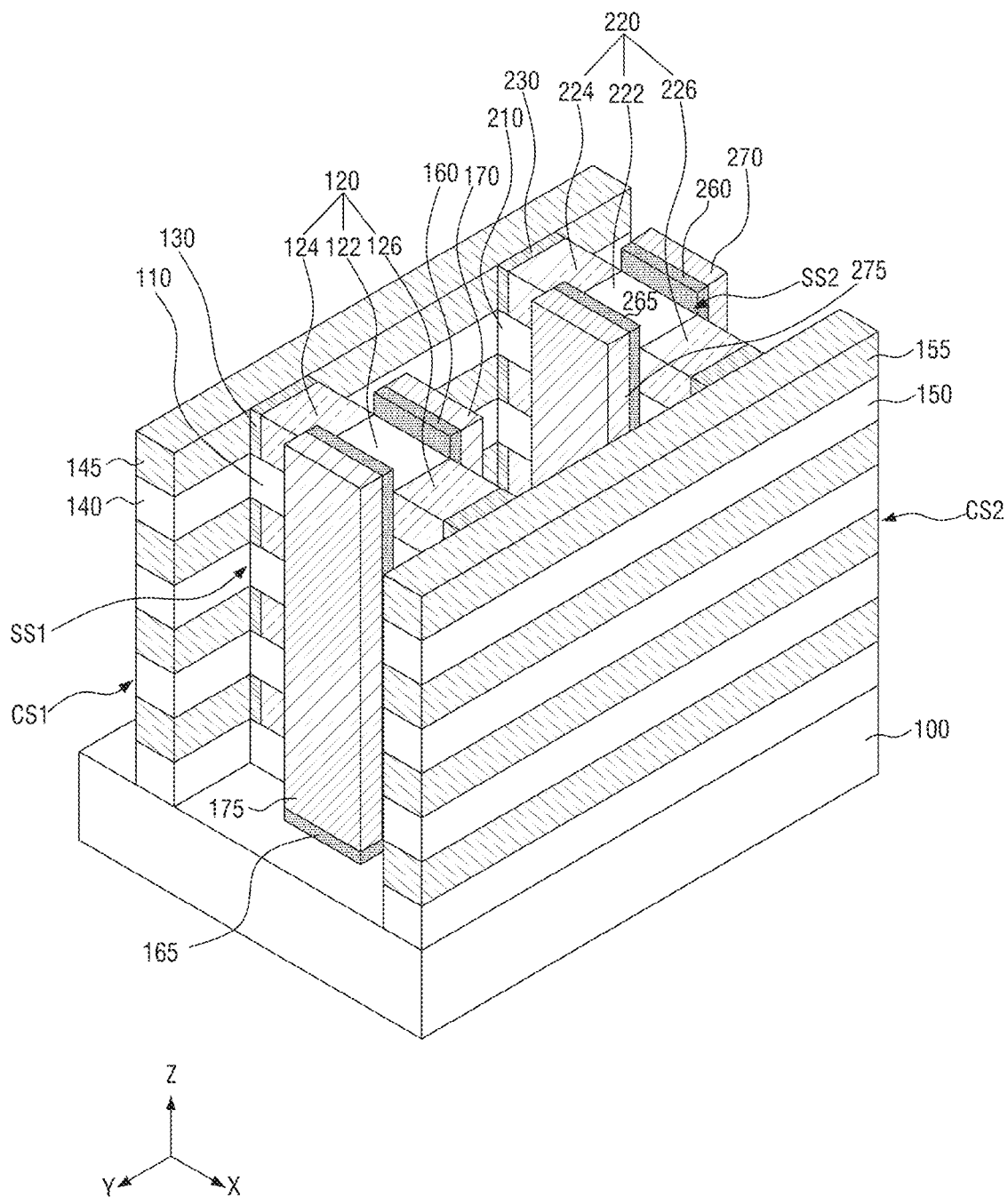
FIG. 21 is a schematic perspective view illustrating a semiconductor device according to an example embodiment.

FIG. 21 is a schematic perspective view illustrating a semiconductor device according to some embodiments. For simplicity of description, a description overlapping with the description with reference to FIGS. 1 to 4 and 13 to 17 will be briefly given or omitted.

Referring to FIG. 21, in the semiconductor device according to some embodiments, the other end of the first stacked structure SS1 and the other end of the second stacked structure SS2 may be connected to the second wiring structure CS2.

Since the second wiring structure CS2 is substantially the same as described above with reference to FIGS. 6 and 7, a detailed description thereof will be omitted below.

Figure 22:
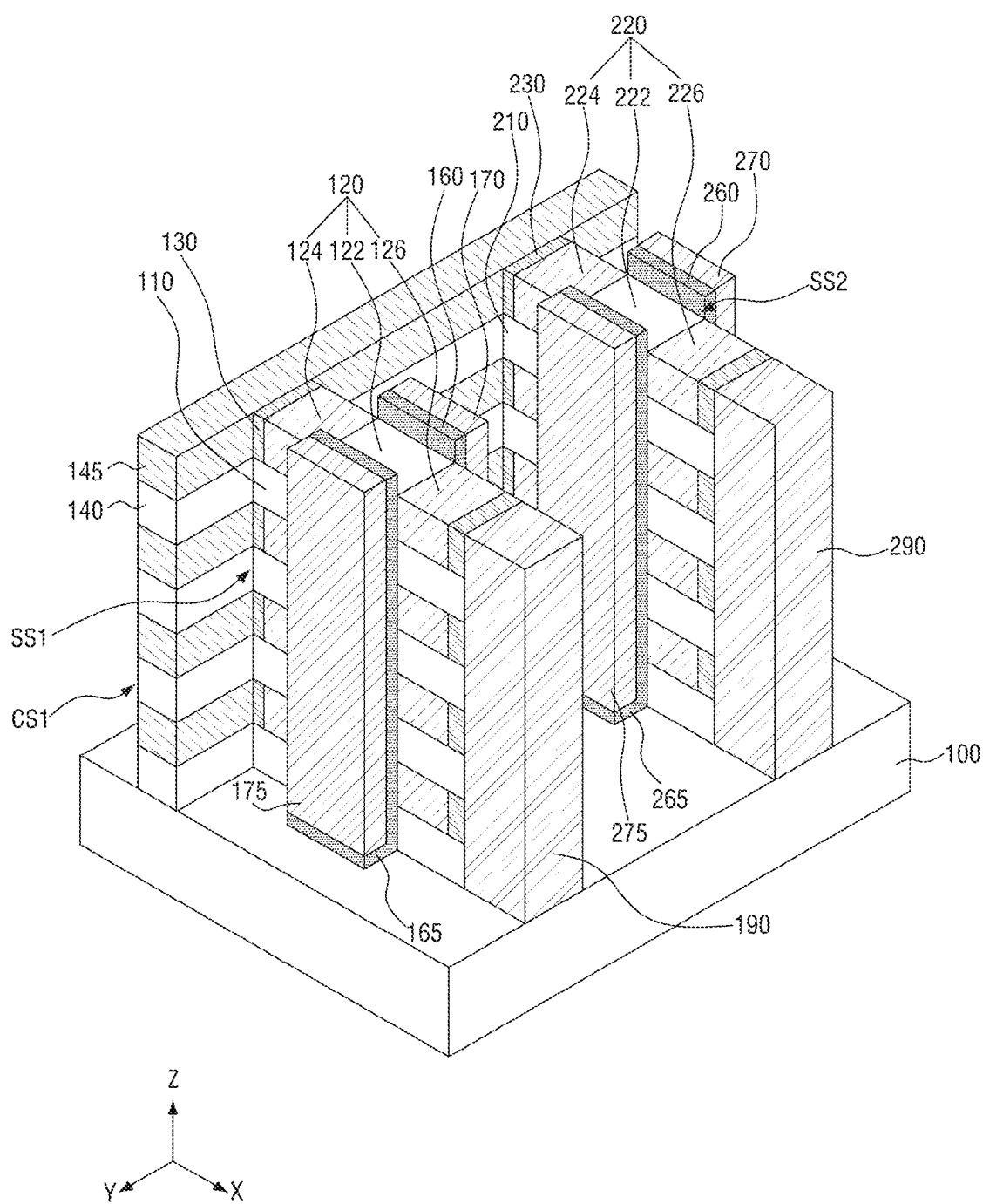
FIG. 22 is a schematic perspective view illustrating a semiconductor device according to an embodiment.

FIG. 22 is a schematic perspective view illustrating a semiconductor device according to some embodiments. For simplicity of description, a description overlapping with the description with reference to FIGS. 1 to 4 and 13 to 17 will be briefly given or omitted.

Referring to FIG. 22, in the semiconductor device according to some embodiments, the other end of the first stacked structure SS1 may be connected to the first capacitor structure 190, and the other end of the second stacked structure SS2 may be connected to the second capacitor structure 290.

Since the first capacitor structure 190 and the second capacitor structure 290 are substantially the same as described above with reference to FIGS. 9 and 10, a detailed description thereof will be omitted.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a first stacked structure including a plurality of first insulating patterns and a plurality of first semiconductor patterns alternately stacked on a substrate, the first stacked structure extending in a first direction, each of a first semiconductor pattern of the plurality of first semiconductor patterns including a first impurity region, a first channel region, and second impurity region arranged in sequential order along the first direction, the first direction being parallel to an upper surface of the substrate;
a first conductive pattern on a first side surface of the first stacked structure, the first conductive pattern extending in a second direction, the second direction crossing the upper surface of the substrate; and
a first ferroelectric layer between the first stacked structure and the first conductive pattern, the first ferroelectric layer extending in the second direction.

2. The semiconductor device of claim 1, wherein the first ferroelectric layer extends along first side surfaces of the first channel regions of the plurality of first semiconductor patterns.

3. The semiconductor device of claim 1, wherein a width of the first conductive pattern in the first direction and a width of the first ferroelectric layer in the first direction are equal to each other.

4. The semiconductor device of claim 1, further comprising a second conductive pattern on a second side surface of the first stacked structure, the second conductive pattern extending in the second direction.

5. The semiconductor device of claim 4, further comprising a second ferroelectric layer between the first stacked structure and the second conductive pattern, the second ferroelectric layer extending in the second direction.

6. The semiconductor device of claim 4, wherein the second conductive pattern is in contact with the first channel regions of the plurality of the first semiconductor patterns.

7. The semiconductor device of claim 1, further comprising a gate dielectric layer between the first stacked structure and the first ferroelectric layer,
the gate dielectric layer extending in the second direction.

8. The semiconductor device of claim 1, further comprising a first wiring structure including a plurality of second insulating patterns and a plurality of first wiring patterns alternately stacked on the substrate, the first wiring structure extending in a third direction parallel to the upper surface of the substrate and crossing the first direction,
wherein each of the plurality of first wiring patterns is connected to the first impurity region of each of the plurality of first semiconductor patterns.

9. The semiconductor device of claim 8, further comprising a capacitor structure connected to the second impurity regions of the plurality of first semiconductor patterns.

10. A semiconductor device comprising:
a first semiconductor pattern on a substrate, the first semiconductor pattern including a first impurity region, a first channel region and a second impurity region sequentially arranged in a first direction, the first direction being parallel to an upper surface of the substrate;
a first gate electrode on a first side surface of the first channel region and a second gate electrode on a second side surface of the first channel region, the first gate electrode and the second gate electrode extending in a second direction, the second direction crossing the upper surface of the substrate;
a first ferroelectric layer between the first channel region and the first gate electrode, the first ferroelectric layer extending in the second direction; and
a second ferroelectric layer between the first channel region and the second gate electrode, the second ferroelectric layer extending in the second direction.

11. The semiconductor device of claim 10, wherein the first gate electrode is configured to have an applied first gate voltage, and the second gate electrode is configured to have an applied second gate voltage different from the applied first gate voltage.

12. The semiconductor device of claim 10, wherein the first ferroelectric layer includes a first ferroelectric material, and the second ferroelectric layer includes a second ferroelectric material different from the first ferroelectric material.

13. The semiconductor device of claim 10, wherein the first ferroelectric layer has a first thickness, and the second ferroelectric layer has a second thickness different from the first thickness.

14. The semiconductor device of claim 10, further comprising:
- a second semiconductor pattern on the substrate, the second semiconductor pattern including a third impurity region, a second channel region and a fourth impurity region sequentially arranged along the first direction;
- a third gate electrode on a first side surface of the second channel region and a fourth gate electrodes on a second side surface of the second channel region, the third gate electrode and the fourth gate electrode extending in the second direction;
- a third ferroelectric layer between the second channel region and the third gate electrode, the third ferroelectric layer extending in the second direction; and
- a fourth ferroelectric layer between the second channel region and the fourth gate electrode, the fourth ferroelectric layer extending in the second direction.

15. The semiconductor device of claim 14, wherein the first to fourth gate electrodes overlap each other in a third direction, the third direction being parallel to the upper surface of the substrate and crossing the first direction.

16. A semiconductor device comprising:
- a first stacked structure including a plurality of first insulating patterns and a plurality of first semiconductor patterns alternately stacked on a substrate, the first stacked structure extending in a first direction, each the plurality of first semiconductor patterns including a first impurity region, a channel region and a second impurity region sequentially arranged along the first direction, the first direction being parallel to an upper surface of the substrate;
- a plurality of first wiring patterns respectively connected to first ends of the plurality of first semiconductor patterns, the plurality of first wiring patterns extending in a second direction parallel to the upper surface of the substrate and crossing the first direction;
- a second wiring pattern connected to second ends of the plurality of first semiconductor patterns;
- a first gate electrode on a first side surface of the first stacked structure between the plurality of first wiring pattern and the second wiring pattern, the first gate electrode extending in a third direction crossing the upper surface of the substrate; and
- a first ferroelectric layer between the first stacked structure and the first gate electrode, the first ferroelectric layer extending in the third direction along a first side surface of the channel regions of the plurality of first semiconductor patterns.

17. The semiconductor device of claim 16, further comprising:
- first silicide layers connecting the first impurity regions of the plurality of first semiconductor patterns to the plurality of first wiring patterns; and
- a second silicide layer connecting the second impurity regions of the plurality of first semiconductor patterns to the plurality of second wiring patterns.

18. The semiconductor device of claim 16, further comprising:
- a second stacked structure including a plurality of second insulating patterns and a plurality of second semiconductor patterns alternately stacked on the substrate, the second stacked structure being spaced apart from the first stacked structure in the second direction, and extending in the first direction;
- a second gate electrode on a first side surface of the second stacked structure, the second gate electrode extending in the third direction; and
- a second ferroelectric layer between the second stacked structure and the second gate electrode, the second ferroelectric layer extending in the third direction.

19. The semiconductor device of claim 18, wherein each of the plurality of first wiring patterns is connected to a first end of each of the plurality of first semiconductor patterns and a first end of each of the plurality of second semiconductor patterns.

20. The semiconductor device of claim 19, wherein the second wiring pattern extends in the third direction and is connected to a second end of each of the plurality of first semiconductor patterns.

* * * * *